United States Patent
Soeno et al.

(10) Patent No.: US 9,722,075 B2
(45) Date of Patent: Aug. 1, 2017

(54) SEMICONDUCTOR DEVICE

(71) Applicants: Akitaka Soeno, Toyota (JP); Yuji Fukuoka, Toyota (JP)

(72) Inventors: Akitaka Soeno, Toyota (JP); Yuji Fukuoka, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/106,918

(22) PCT Filed: Oct. 16, 2014

(86) PCT No.: PCT/JP2014/077497
§ 371 (c)(1),
(2) Date: Jun. 21, 2016

(87) PCT Pub. No.: WO2015/098246
PCT Pub. Date: Jul. 2, 2015

(65) Prior Publication Data
US 2017/0040448 A1    Feb. 9, 2017

(30) Foreign Application Priority Data
Dec. 25, 2013  (JP) .................................. 2013-267786

(51) Int. Cl.
*H01L 29/78*    (2006.01)
*H01L 29/66*    (2006.01)
(Continued)

(52) U.S. Cl.
CPC ...... *H01L 29/7827* (2013.01); *H01L 29/0634* (2013.01); *H01L 29/0661* (2013.01);
(Continued)

(58) Field of Classification Search
None
See application file for complete search history.

(56) References Cited

U.S. PATENT DOCUMENTS

| | | |
|---|---|---|
| 2008/0087951 A1 | 4/2008 | Takaya et al. |
| 2013/0087852 A1 | 4/2013 | Kim et al. |
| | (Continued) | |

FOREIGN PATENT DOCUMENTS

| | | |
|---|---|---|
| JP | 4414863 B2 | 2/2010 |
| JP | 4735235 B2 | 7/2011 |

*Primary Examiner* — Whitney T Moore
(74) *Attorney, Agent, or Firm* — Oliff PLC

(57) ABSTRACT

Described herein is a semiconductor device including a semiconductor substrate in which an element region and a termination region surrounding the element region are provided. The element region includes: a gate trench; a gate insulating film; and a gate electrode. The termination region includes: a plurality of termination trenches provided around the element region; an inner trench insulating layer located inside of each of the plurality of termination trenches; and an upper surface insulating layer located at an upper surface of the semiconductor substrate in the termination region. The upper surface insulating layer includes a first portion and a second portion having a thinner thickness than the first portion and located at a location separated from the element region than the first portion, and a gate wiring is located at an upper surface of the first portion and is not located at an upper surface of the second portion.

6 Claims, 17 Drawing Sheets

(51) Int. Cl.
*H01L 29/739* (2006.01)
*H01L 29/06* (2006.01)

(52) U.S. Cl.
CPC .... *H01L 29/66666* (2013.01); *H01L 29/7397* (2013.01); *H01L 29/78* (2013.01)

(56) References Cited

U.S. PATENT DOCUMENTS

2013/0341751 A1\* 12/2013 Ono ........................ H01L 23/58
257/488
2014/0183620 A1\* 7/2014 Takaya .............. H01L 29/42372
257/328

\* cited by examiner

SEMICONDUCTOR DEVICE

TECHNICAL FIELD

This application is a related application to and claims priority to Japanese Patent Application No. 2013-267786 filed on Dec. 25, 2013, the entire contents of which are hereby incorporated by reference into the present application.

A technology disclosed herein relates to a semiconductor device.

BACKGROUND ART

Japanese Patent No. 4735235 (hereinafter referred to as "Patent Document 1") discloses a semiconductor device including a semiconductor substrate in which an element region and a termination region located outside of the element region are provided. The element region includes: a gate trench; a gate insulating film covering an inner surface of the gate trench; and a gate electrode located inside of the gate insulating film. The termination region includes: a termination trench; and a termination insulating layer filling an inner part of the termination trench and covering an upper surface of the semiconductor substrate. A gate wiring electrically connected to the gate electrode is disposed at an upper surface of the termination insulating layer.

SUMMARY OF INVENTION

Technical Problem

The termination insulating layer is formed by depositing an insulating material and then performing heat treatment thereto. As in the technology of Patent Document 1, depositing the termination insulating layer uniformly over an entire area of the upper surface of the semiconductor substrate in the termination region causes the insulating material to contract in a case where a temperature of the subsequent heat treatment is high, thus making it easy for deterioration to occur.

The present specification discloses a semiconductor device that can restrain the insulating layer of the termination region from deteriorating and a method for manufacturing such a semiconductor device.

Solution to Technical Problem

An aspect of a technique described herein is a semiconductor device comprising a semiconductor substrate in which an element region and a termination region surrounding the element region are provided. The element region comprises: a gate trench; a gate insulating film covering an inner surface of the gate trench; and a gate electrode located inside of the gate insulating film. The termination region comprises: a plurality of termination trenches provided around the element region; an inner trench insulating layer located inside of each of the plurality of termination trenches; and an upper surface insulating layer located at an upper surface of the semiconductor substrate in the termination region. The upper surface insulating layer comprises a first portion and a second portion having a thinner thickness than the first portion and located at a location separated from the element region than the first portion, and a gate wiring is located at an upper surface of the first portion and is not located at an upper surface of the second portion.

In the semiconductor device described above, the upper surface insulating layer includes a first portion and a second portion having a thinner thickness than the first portion and located at a location separated from the element region than the first portion. A gate wiring is located at an upper surface of the first portion and is not located at an upper surface of the second portion. That is, since the second portion, in which the gate wiring is not located, has a thinner thickness than the first portion, a total amount of an insulating material that is used for the upper insulating layer can be made smaller than in a case where an upper insulating layer having a uniform thickness is formed over the entire area of the termination region. An amount of contraction of the insulating material in a process of manufacturing the semiconductor device can be restrained to be small by reducing the total amount of the insulating material. This prevents an excessive stress from being generated in the insulating material in the process of manufacturing the semiconductor device. Therefore, this makes it possible to restrain the insulating layer from deteriorating.

The upper surface insulating layer may comprise: a first layer; and a second layer having higher phosphorus and boron contents per unit volume than the first layer and located at an upper surface of the first layer. The upper surface insulating layer in a first region may comprise the first layer and the second layer. The upper surface insulating layer in a second region which is a location separated from the element region than the first region, may comprise the second layer and the first layer having a thinner thickness than the first layer in the first region, or comprises the second layer and does not comprise the first layer. The gate wiring may be located at an upper surface of the upper insulating layer in the first region and may not be located at an upper surface of the upper insulating layer in the second region.

This configuration makes it possible to thickly form the first layer in the first region in which the gate wiring is located. Therefore, this makes it possible to appropriately form the first region that is thicker than the second region.

An aspect of a technique described herein is a manufacturing method of a semiconductor device, the method comprising: forming an insulating layer in each of a plurality of trenches provided in a semiconductor substrate and at an upper surface of the semiconductor substrate; etching back the insulating layer formed at the upper surface of the semiconductor substrate in a region in which a part of the plurality of trenches is formed; and forming a gate wiring at an upper surface of the insulating layer which was not etched back such that the gate wiring does not make contact with a region which was etched back.

The manufacturing method described above makes it possible to form a thick insulating layer in a region which was not etched back and form a semiconductor device in which a gate wiring is located at an upper surface of the insulating layer. That is, by thinly forming an insulating layer in a region in which the gate wiring is not located, the total amount of the insulating material that forms the insulating layer can be reduced. By reducing the total amount of the insulating material, an amount of contraction of the insulating layer in the process of manufacturing the semiconductor device can be restrained to be small. This prevents an excessive stress from being generated by the contraction of the insulating material in the process of manufacturing the semiconductor device, thus making it possible to restrain the insulating layer from deteriorating.

Another aspect of a technique described herein is a semiconductor device comprising a semiconductor substrate in which an element region and a termination region surrounding the element region are provided. The element region comprises; a gate trench; a gate insulating film covering an inner surface of the gate trench; and a gate electrode located inside of the gate insulating film. The termination region comprises: a plurality of termination trenches provided around the element region; and an insulating layer provided inside of each of the plurality of termination trenches and at an upper surface of the semiconductor substrate. The insulating layer comprises: a first layer; and a second layer having higher phosphorus and boron contents per unit volume than the first layer and located at an upper surface of the first layer. A plurality of concave portions is provided at an upper surface of the first layer. Each of the concave portions is extended along a partition wall between adjacent ones of the termination trenches. An interval between adjacent ones of the concave portions is longer than an interval between the adjacent ones of the termination trenches. The second layer is filled in each of the concave portions. A gate wiring is located at an upper surface of the insulating layer.

In the semiconductor device described above, the concave portions are provided in the first layer. Since the first layer has a thin thickness in the concave portions, a stress is difficult to be generated in the first layer. Therefore, even if a stress is generated in the first layer by the contraction or the like of the first layer, the stress is relaxed by the concave portions. This prevents an excessive stress from being generating in the first layer, thus making it possible to restrain the insulating layer from deteriorating.

The first layer may comprise: a first insulating layer covering an inner surface of each of the plurality of termination trenches; and a second insulating layer filled inside of the plurality of termination trenches covered by the first insulating layer. A refraction index of the first insulating layer may be larger than a refraction index of the second insulating layer.

In the semiconductor device described above, the refraction index of the first insulating layer is larger than the refraction index of the second insulating layer. The first insulating layer is difficult to contract in the process of manufacturing the semiconductor device. The second insulating layer is easy to contract in the process of manufacturing the semiconductor device. Since the first insulating layer and the second insulating layer are located in the termination trenches, an excessive stress is prevented from being generated in the insulating material in the process of manufacturing the semiconductor device. Therefore, in the process of manufacturing the semiconductor device, the insulating layers in the termination trenches can be restrained from deteriorating. Further, although the first insulating layer is not very good in embeddability in the process of manufacturing the semiconductor device, the embeddability of the insulating material will not be problematic during formation of the first insulating layer, as the first insulating layer is formed to cover the inner surface of each of termination trenches. Thereafter, in forming the second insulating layer at a surface of the first insulating layer, the second insulating layer can be suitably formed, as the insulating material is good in embeddability. Therefore, in the process of manufacturing the semiconductor device, a void is difficult to be generated in the insulating layers in the termination trenches.

The first insulating layer and the second layer may be laminated on the partition wall corresponding to the concave portions, the second insulating layer is not laminated on the partition wall corresponding to the concave portions. The first insulating layer, the second insulating layer, and the second layer may be laminated on the partition wall not corresponding to the concave portions.

This configuration allows the second insulating layer, which is easy to contract in the process of manufacturing the semiconductor device, to be discontinuous in the concave portions, thus making it possible to relax a stress that is generated in the second insulating layer. This makes it possible to more appropriately suppress deterioration of the insulating layers.

The first layer may comprise a third insulating layer provided at an upper surface of the second insulating layer. A refraction index of the third insulating layer may be larger than the refraction index of the second insulating layer.

The third insulating layer, whose refraction index is large, is difficult to contract in the process of manufacturing the semiconductor device. This configuration makes it possible to restrain the first layer (i.e., the first insulating layer, the second insulating layer, and the third insulating layer) at the upper surface of the semiconductor substrate from deteriorating. Further, since the thick first layer can be formed at the upper surface of the semiconductor substrate, the semiconductor device can also be made higher in voltage resistance.

DESCRIPTION OF EMBODIMENTS

First Embodiment (Structure of Semiconductor Device 100)

Figure 1:
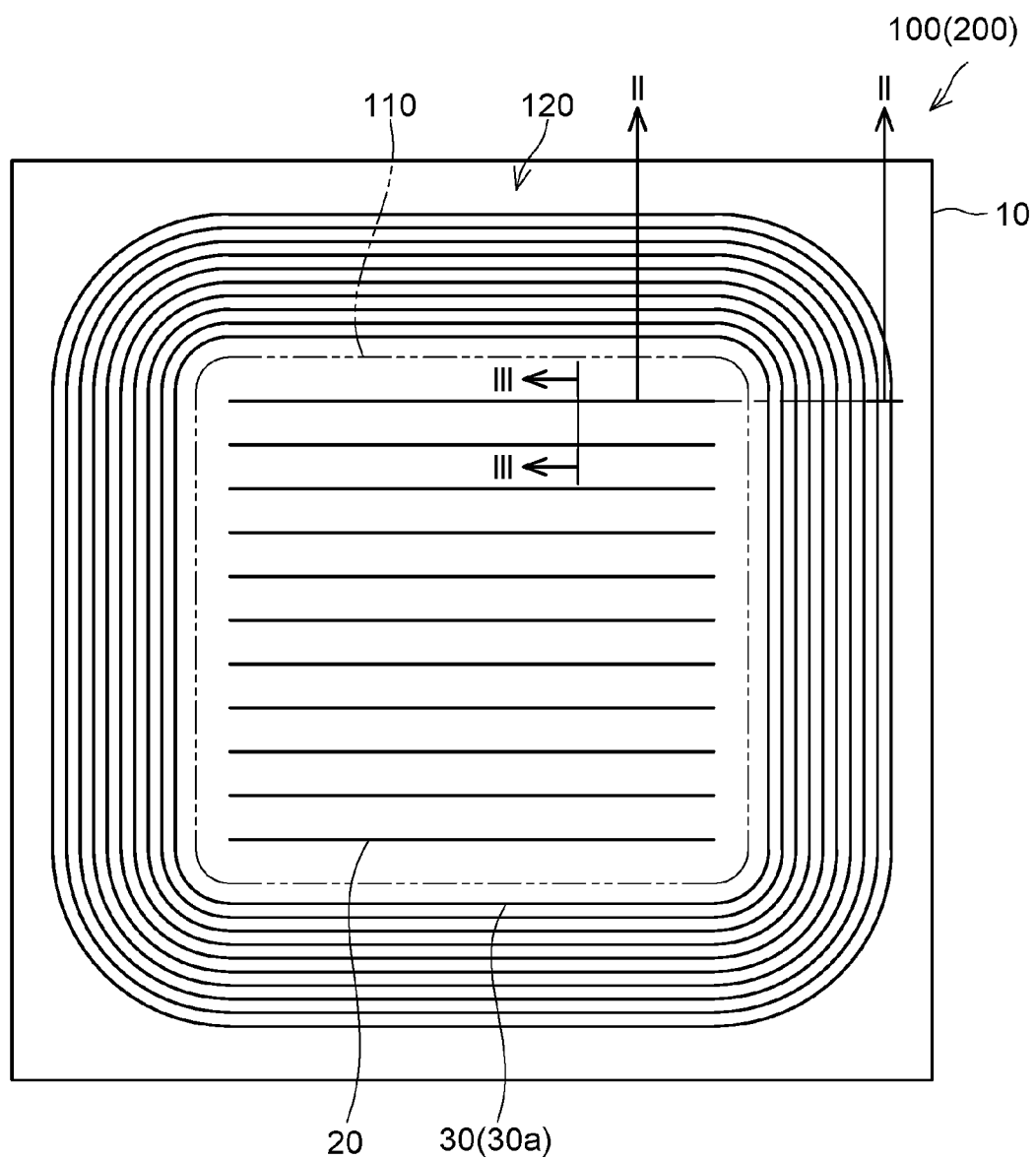
FIG. 1 is a plan view of a semiconductor device according to a first embodiment and a second embodiment.

As shown in FIG. 1, a semiconductor device 100 according to a first embodiment includes a semiconductor substrate 10 in which an element region 110 through which an electric current flows and a termination region 120 surrounding the element region 110 are provided. The semiconductor device 100 according to the first embodiment is a power MOSFET.

As shown in FIG. 1, the element region 110 includes a plurality of gate trenches 20 extending parallel to each other. The termination region 120 includes a plurality of termination trenches 30 surrounding an outside of the element region 110. Each of the termination trenches 30 encircles around the outside of the element region 110. It should be noted that, for ease of understanding. FIG. 1 omits to illustrate various types of insulating layers, electrodes, wiring provided at an upper surface of the semiconductor substrate 10.

Figure 2:
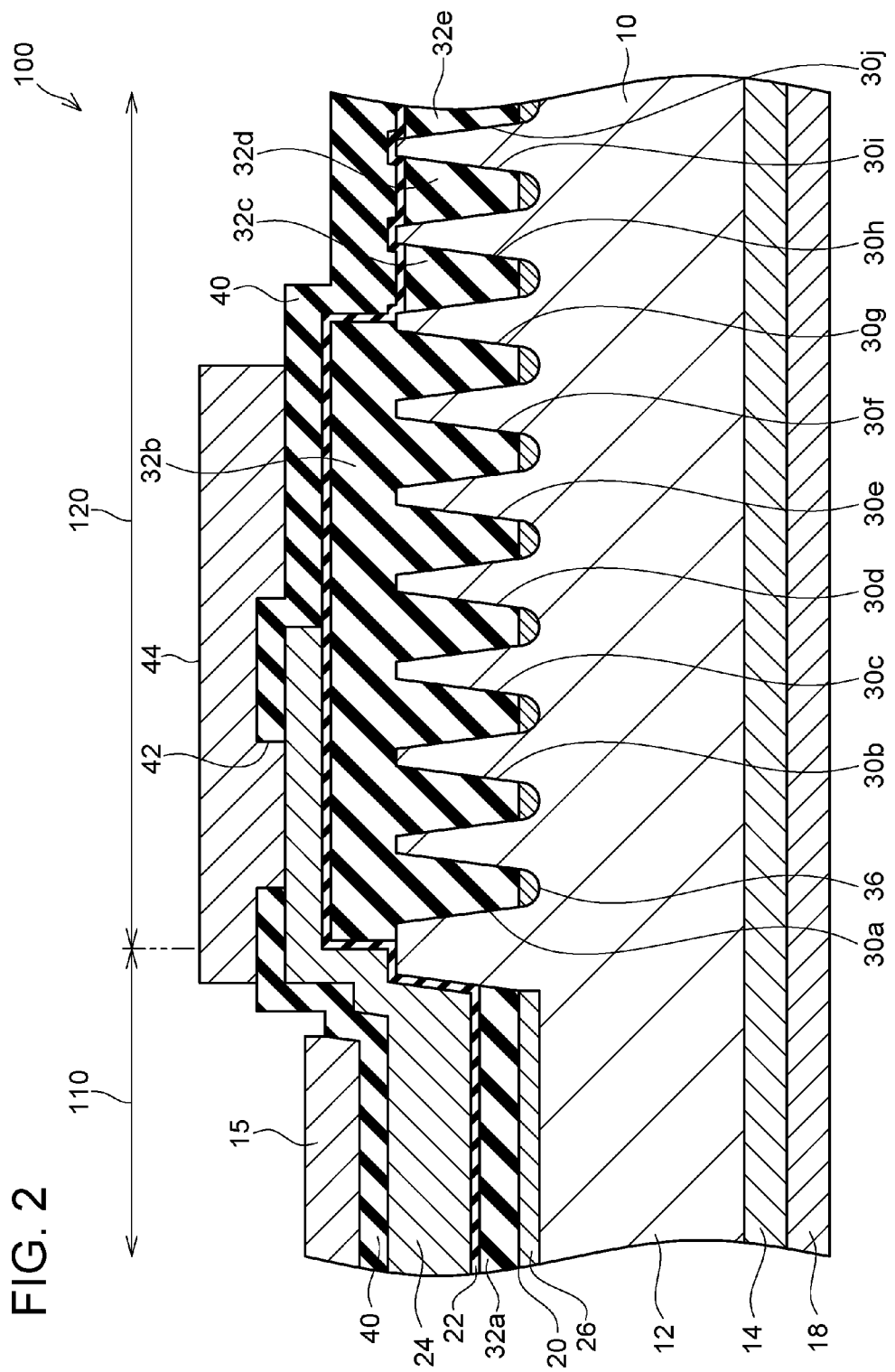
FIG. 2 is a cross-sectional view of the semiconductor device according to the first embodiment as taken along line II-II.
Figure 3:
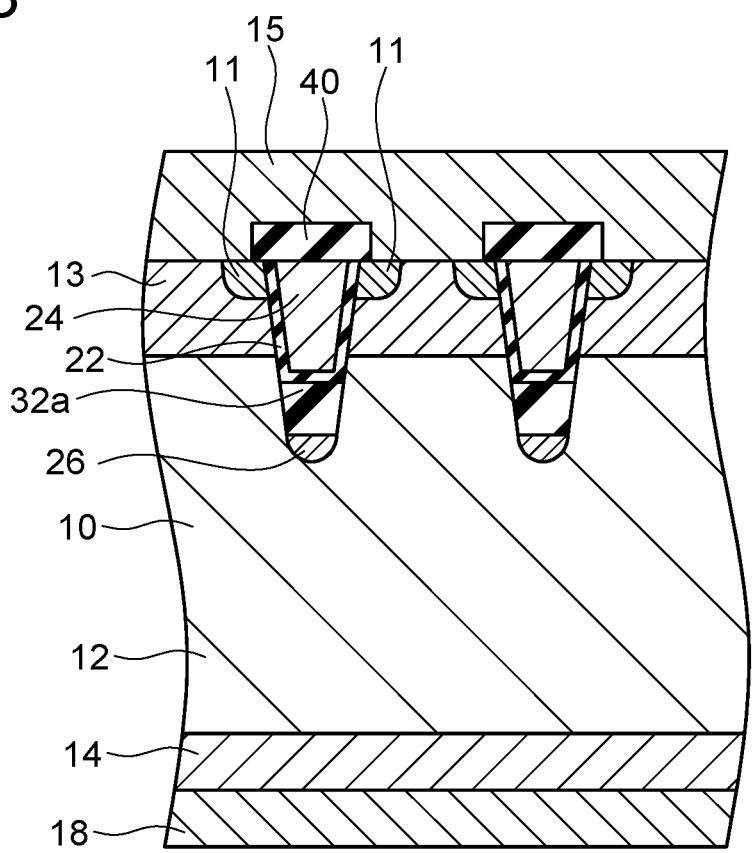
FIG. 3 is a cross-sectional view of the semiconductor device according to the first embodiment as taken along line III-III.

With reference to FIGS. 2 and 3, structures in the element region 110 and the termination region 120 will be described. As shown in FIG. 2, an n-type drift region 12 is provided in the semiconductor substrate 10 in the element region 110. Further, as shown in FIG. 3, an $n^+$-type source region 11 is provided in an area facing a surface of the semiconductor substrate 10. Further, a p-type body region 13 is provided below the source region 11 and above the drift region 12. An $n^+$-type drain region 14 is provided in an area facing a back surface of the semiconductor substrate 10. An upper surface of the source region 11 is in ohmic contact with a source electrode 15. A lower surface of the drain region 14 is in ohmic contact with a drain electrode 18.

Further, as noted above, the plurality of gate trenches 20 is provided at the surface of the semiconductor substrate 10 in the element region 110. A p-type floating region 26 is provided at a lower end of each of the gate trenches 20. An embedded insulating layer 32a is provided in a lower part inside of the gate trench 20. A gate insulating film 22 is provided above the embedded insulating layer 32a and at an inner-side surface of the gate trench 20. A gate electrode 24 filled in the gate trench 20 is provided inside of the gate insulating film 22. An interlayer insulating film 40 is provided at an upper surface of the gate electrode 24. The interlayer insulating film 40 allows the gate electrode 24 to be electrically insulated from the source electrode 15. The interlayer insulating film 40 has higher phosphorus and boron contents per unit volume than the embedded insulating layer 32.

As shown in FIG. 2, an n-type drift region 12 and an $n^+$-type drain region 14 are also provided in the semiconductor substrate 10 in the termination region 120. The drift region 12 and the drain region 14 in the termination region 120 are continuous with the drift region 12 and the drain region 14 in the element region 110. Also in the termination region 120, the lower surface of the drain region 14 is in ohmic contact with the drain electrode 18.

The plurality of termination trenches 30a to 30j are provided at the surface of the semiconductor substrate 10 in the termination region 120. Each of the termination trenches 30a to 30j is provided at substantially a same depth as the gate trenches 20 in the element region 110. A p-type floating region 36 is provided at a lower end of each of the termination trenches 30a to 30j. The plurality of termination trenches 30a to 30j shown in FIG. 2 may be herein collectively referred to as "termination trenches 30."

The plurality of termination trenches 30a to 30j includes the termination trenches 30a to 30g which are close to the element region 110 and inside of which an embedded insulating layer 32b is provided. The embedded insulating layer 32b is also laminated on the upper surface of the semiconductor substrate 10 in the termination region 120. The embedded insulating layer 32b in the termination region 120 is an insulating layer having same properties as the embedded insulating layer 32a in the element region 110.

The plurality of termination trenches 30a to 30j includes the termination trenches 30h, 30i, and 30j which are provided at a location separated from the element region 110 than the termination trenches 30a to 30g and inside of which embedded insulating layers 32c, 32d, and 32e are provided, respectively. The embedded insulating layers 32c, 32d, and 32e are not provided at the upper surface of the semiconductor substrate 10. Upper surfaces of the embedded insulating layers 32c, 32d, and 32e are located in the termination trenches 30h, 30i, and 30j, respectively. That is, the embedded insulating layers 32c, 32d, and 32e are not continuous with one another. Further, the embedded insulating layer 32c is not continuous with the embedded insulating layer 32b, either. It should be noted that the embedded insulating layers 32c, 32d, and 32e, too, are insulating layers having the same properties as the embedded insulating layer 32a in the element region 110.

A gate insulating film 22 is provided at the upper surfaces of the embedded insulating layers 32b, 32c, 32d, and 32e. The gate insulating film 22 in the termination region 120 is continuous with the gate insulating film 22 in the element region 110. The gate insulating film 22 is also provided at an upper surface of a partition wall between the termination trenches 30g and 30h, an upper surface of a partition wall between the termination trenches 30h and 30i, and an upper surface of a partition wall between the termination trenches 30i and 30j.

The gate insulating film 22 in the termination region 120 includes a portion provided at the upper surface of the embedded insulating layer 32b, and at an upper surface of this portion, a part of the gate electrode 24 provided in the element region 110 is extended. An interlayer insulating film 40 is provided at the upper surface of the gate electrode 24 and an upper surface of the gate insulating film 22 in an area in which the gate electrode 24 is not provided. The interlayer insulating film 40 in the termination region 120 is continuous with the interlayer insulating film 40 in the element region 110. The interlayer insulating film 40 in the termination region 120 includes a portion provided at the upper surface of the gate electrode 24, and in this portion, a contact hole 42 is provided. A gate wiring 44 is provided at an upper surface of the interlayer insulating film 40 in the termination region 120. The gate wiring 44 is electrically connected to the gate electrode 24 through the contact hole 42.

In the semiconductor device 100 according to the first embodiment, the gate wiring 44 is provided above the embedded insulating layer 32b and is not provided above the embedded insulating layers 32c, 32d, and 32e. In other words, in the semiconductor device 100 according to the first embodiment, the gate wiring 44 is provided at an upper surface of a portion in which the embedded insulating layer 32b and the interlayer insulating film 40 are provided at the upper surface of the semiconductor substrate 10 (i.e., a portion in which a thick insulating layer is provided) and is not provided in a portion in which only the interlayer insulating film 40 is provided at the upper surface of the semiconductor substrate 10 (i.e., a portion in which a thin insulating layer is provided, above the termination trenches 30h to 30j).

(Manufacturing Method)

Figure 4:
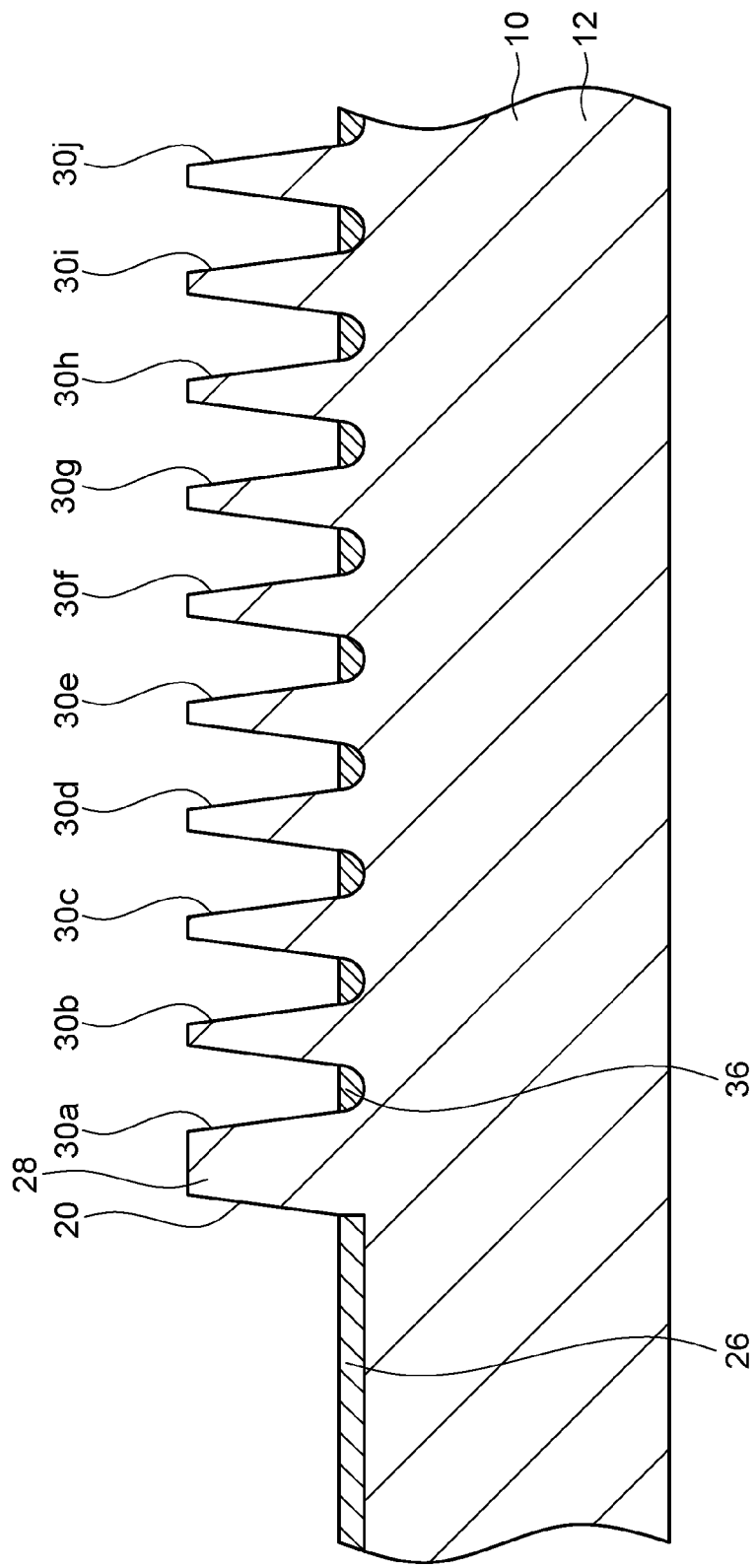
FIG. 4 is a cross-sectional view (1) schematically showing a method of manufacturing a semiconductor device according to the first embodiment.

The following will describe a method of manufacturing the semiconductor device 100 according to the first embodiment. First, as shown in FIG. 4, a semiconductor substrate 10 is prepared with the Plurality of gate trenches 20 and the plurality of termination trenches 30a to 30j formed therein. In the first embodiment, the semiconductor substrate 10 is made of SiC. It should be noted that FIG. 4 illustrates only one gate trench 20. At the point in time shown in FIG. 4, the floating region 26 has been formed at the lower end of each of the gate trenches 20. Further, the floating region 36 has been formed at the lower end of each of the termination trenches 30a to 30j. Further, at this point in time, the drift region 12, the body region 13, and the source region 11 have been formed in the semiconductor substrate 10.

Figure 5:
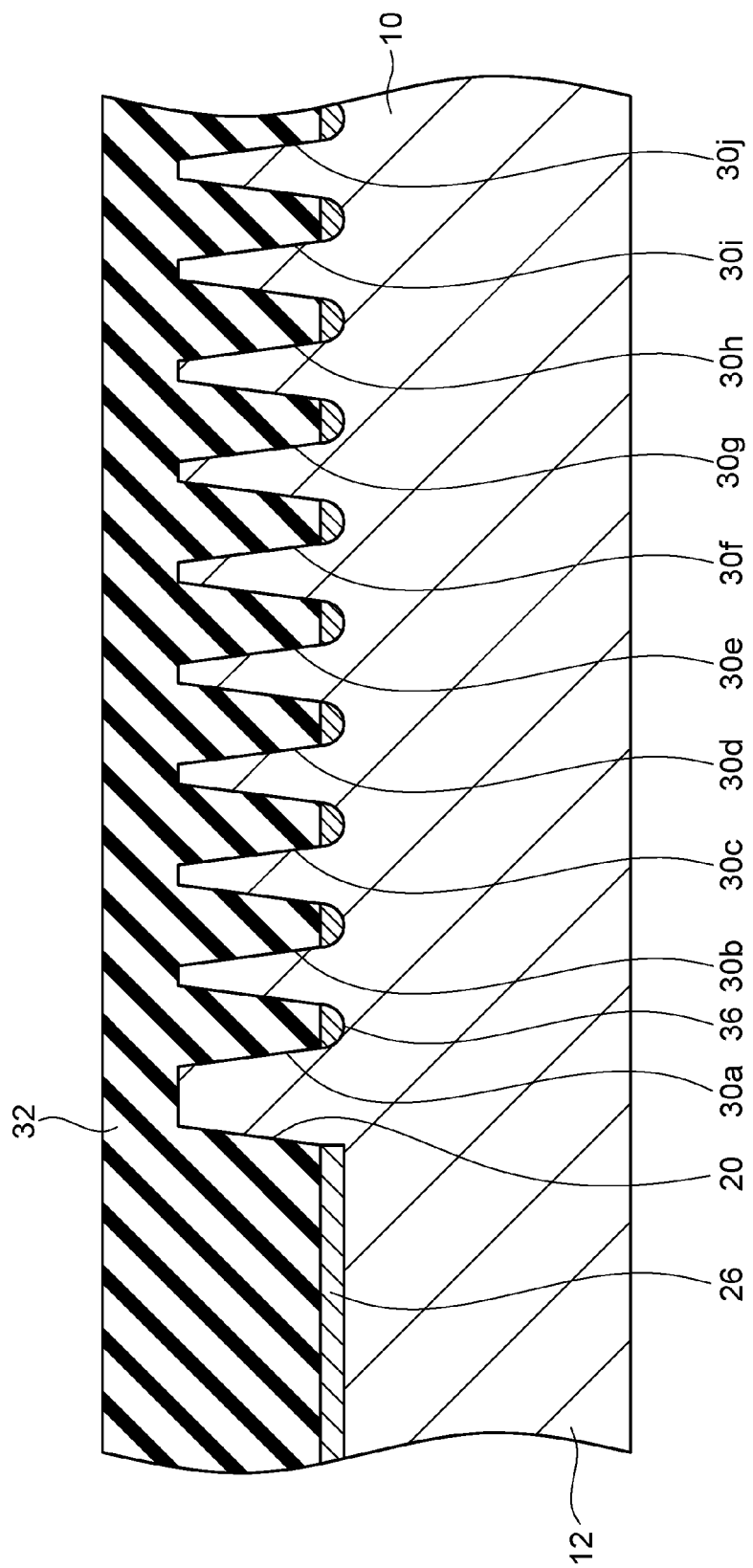
FIG. 5 is a cross-sectional view (2) schematically showing the method of manufacturing a semiconductor device according to the first embodiment.

Next, as shown in FIG. 5, an embedded insulating layer 32 is deposited at an inner surface of each of the gate trenches 20, in each of the termination trenches 30a to 30j, and on the upper surface of the semiconductor substrate 10 (i.e., on an upper surface of a partition wall 28 between the gate trenches 20 and the termination trench 30a and on upper surfaces of partition walls between the adjacent termination trenches 30). The embedded insulating layer 32 fills each of the trenches and is also laminated on the upper surface of the semiconductor substrate 10. The embedded insulating layer 32 is formed by performing CVD (chemical vapor deposition) with TEOS (Tetra Ethyl Ortho Silicate) as a raw material.

Figure 6:
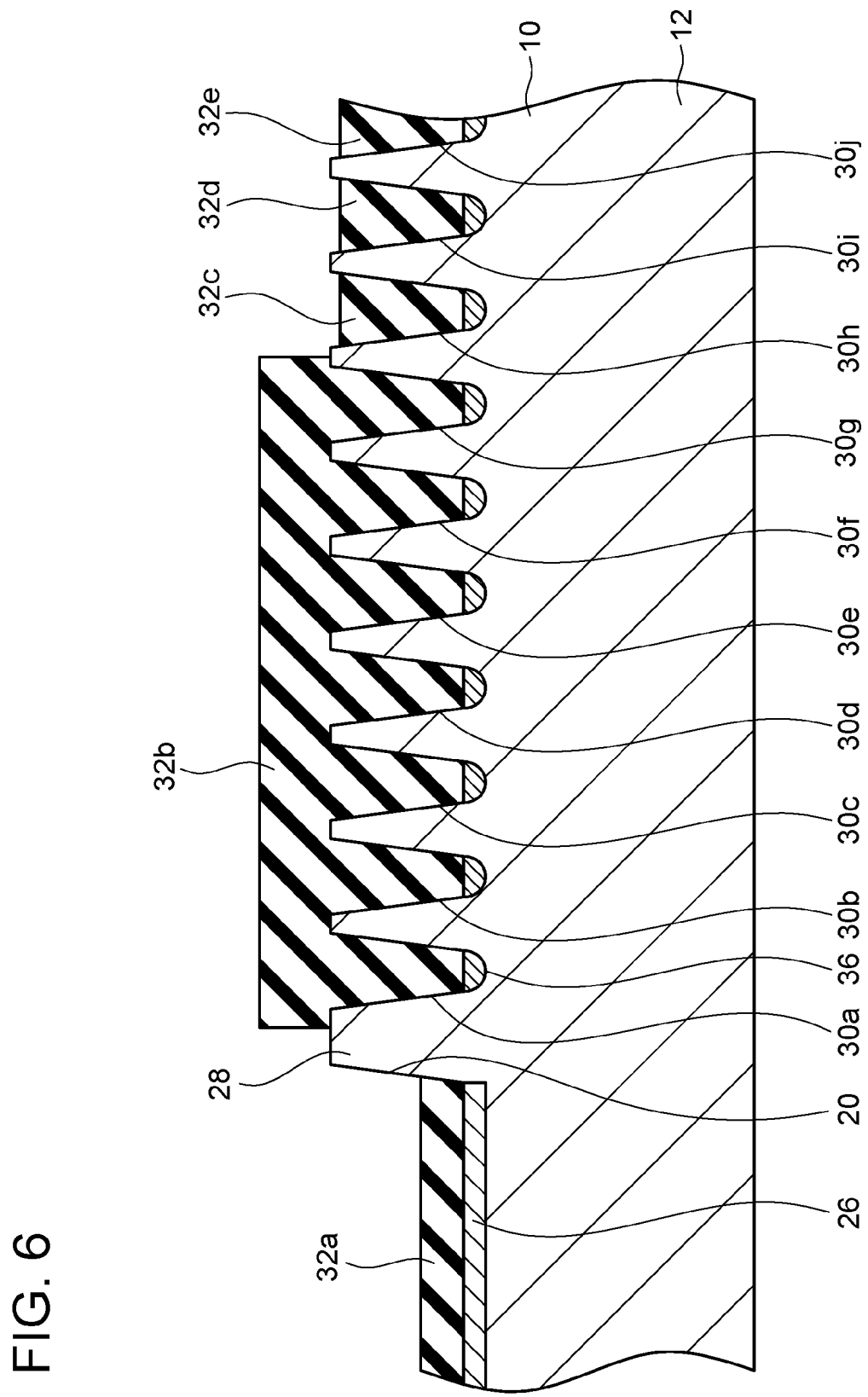
FIG. 6 is a cross-sectional view (3) schematically showing the method of manufacturing a semiconductor device according to the first embodiment.

Next, as shown in FIG. 6, a part of the embedded insulating layer 32 in the gate trenches 20 is removed by etch back. At the same time, a part of the embedded insulating layer 32 at the upper surface of the partition wall between the gate trenches 20 and the termination trench 30a is also removed. Furthermore, parts of the embedded insulating layer 32 above the termination trenches 30h, 30i, and 30j are also removed. The etch back is performed by performing dry etching after forming a protective film above the termination trenches 30a to 30g. This etch back causes the embedded insulating layer 32 formed in FIG. 5 to be divided into a plurality of portions. That is, a part of the embedded insulating layer 32, i.e., an embedded insulating layer 32a, remains near a lower part in the gate trenches 20. Further, an embedded insulating layer 32b is formed insides of the termination trenches 30a to 30g and above the termination trenches 30a to 30g. Further, embedded insulating layers 32c, 32d, and 32e are formed insides of the termination trenches 30h, 30i, and 30j, respectively. The embedded insulating layers 32c, 32d, and 32e are not formed at the upper surface of the semiconductor substrate 10, and the upper surfaces of the embedded insulating layers 32c, 32d, and 32e are located in the termination trenches 30h, 30i, and 30j, respectively. That is, the embedded insulating layers 32c, 32d, and 32e are not continuous with one another. Further, the embedded insulating layer 32c is not continuous with the embedded insulating layer 32b, either.

Next, the semiconductor substrate 10 is subjected to heat oxidation treatment. This densities and stabilizes the embedded insulating layers 32a to 32e that have been formed by the CVD. During the heat treatment, each of the embedded insulating layers contracts. As noted above, the embedded insulating layers 32b to 32e insides of and above the plurality of termination trenches 30a to 30j are not continuous with one another. Therefore, the total mount of an insulating material in the embedded insulating layers 32b to 32e is small, and the amount of contraction during the heat treatment can be restrained to be small. This restrains a high stress from being generated hi each of the embedded insulating layers. This in turn makes it possible to restrain the embedded insulating layers 32b to 32e from deteriorating or specifically, for example, from cracking. Further, this heat oxidation treatment also serves as a process for forming a sacrificial oxide film on inner wall surfaces of the gate trenches 20. Therefore, this heat oxidation treatment allows a sacrificial oxide film to be formed on the inner wall surfaces of the gate trenches 20. Thereafter, the oxide film formed on the inner wall surfaces of the gate trenches 20 is removed by wet etching. This removes a layer damaged by dry etching.

Figure 7:
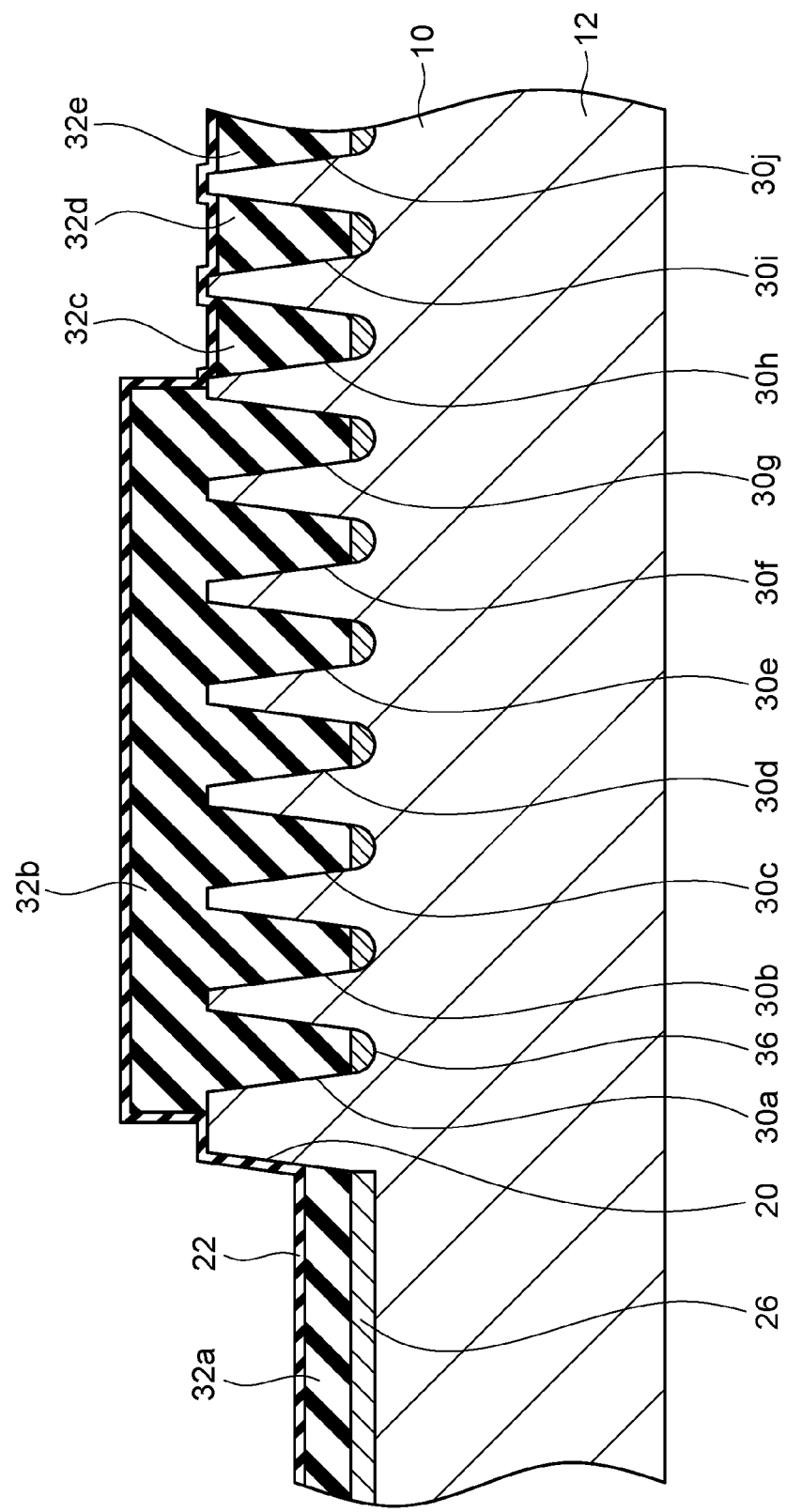
FIG. 7 is a cross-sectional view (4) schematically showing the method of manufacturing a semiconductor device according to the first embodiment.

Next, as shown in FIG. 7, the gate insulating film 22 is formed by CVD or the like.

Figure 8:
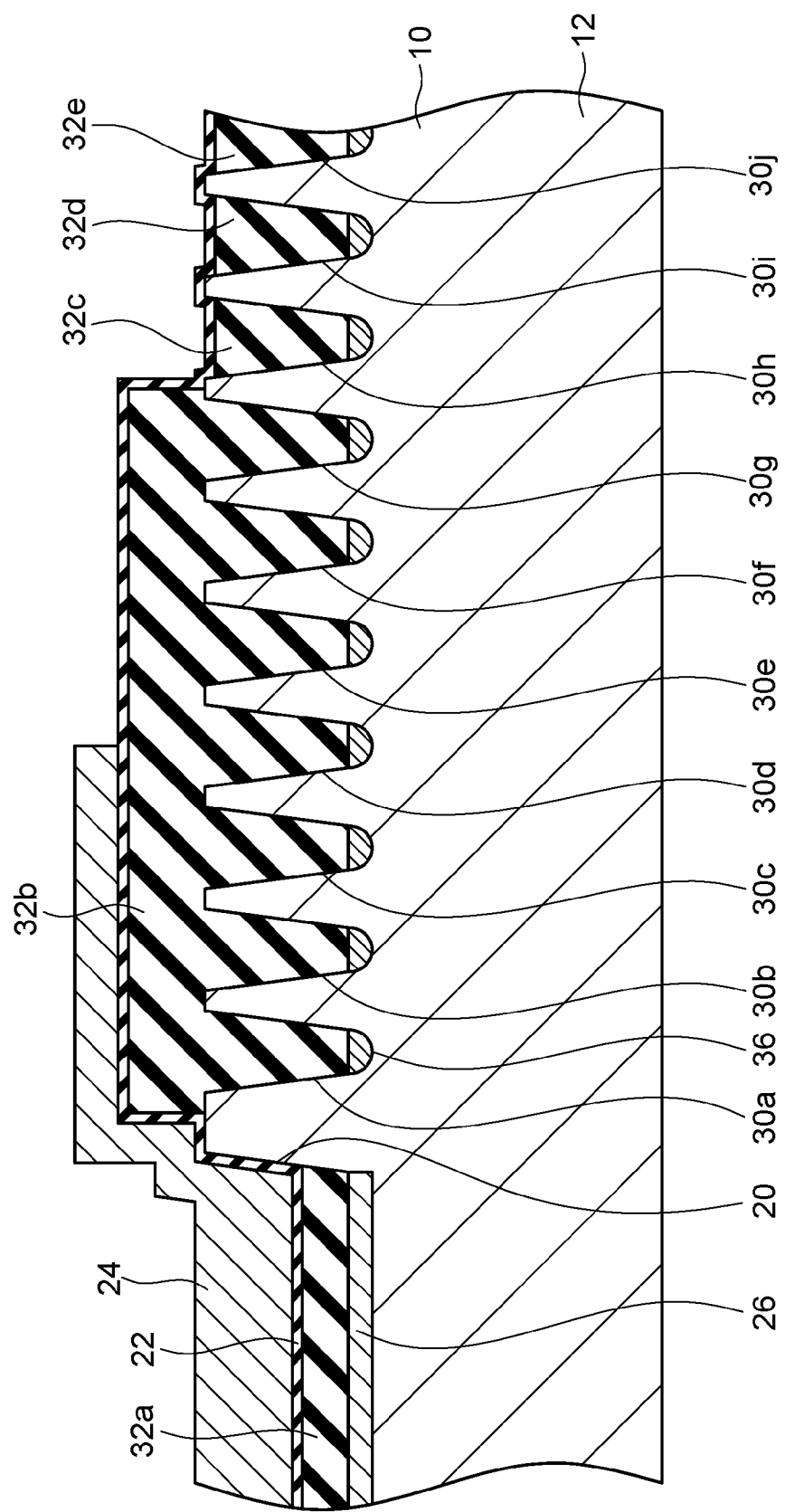
FIG. 8 is a cross-sectional view (5) schematically showing the method of manufacturing a semiconductor device according to the first embodiment.

Next, as shown in FIG. 8, the gate electrode 24 is formed in the trench gates 20 by depositing polysilicon in a space in the trench gates 20 that has been secured by etch back. At this occasion, a part of the gate electrode 24 extends onto an upper surface of the gate insulating film 22 formed above the termination trenches 30a to 30d.

Thereafter, the interlayer insulating film 40 is formed at the upper surface of the semiconductor substrate 10 (see FIG. 2). The interlayer insulating film 40 is formed by depositing BPSG (Boron Phosphorus Silicon Glass) by CVD. As noted above, the interlayer insulating film 40, which is made of BPSG, has higher phosphorus and boron contents per unit volume than the embedded insulating films 32a to 32e, which are TEOS films. As a result of this, the interlayer insulating film 40 is formed at an upper surface of the gate electrode 24 and the upper surface of the gate insulating film 22 in an area in which the gate electrode 24 is not formed.

Thereafter, the contact hole 42 is formed in a portion of the interlayer insulating film 40 that is formed at the upper surface of the gate electrode 24 (see FIG. 2). Next, the gate wiring 44 made of metal is formed at an upper surface of the interlayer insulating film 40. The gate wiring 44 is electrically connected to the gate electrode 24 through the contact hole 42. This causes the gate wiring 44 to be formed above the embedded insulating layer 32b. The gate wiring 44 is not formed above the embedded insulating layers 32c, 32d, and 32e. In other words, the gate wiring 44 is formed above the embedded insulating layer 32b in a region that was not etched back (i.e., a region in which the termination trenches 30a to 30g are formed) such that the gate wiring 44 does not make contact with a region that was etched back (i.e., a region in which the termination trenches 30h, 30i, and 30j are formed).

Furthermore, thereafter, the drain region 14 is formed on the back surface of the semiconductor substrate 10. The drain region 14 is formed by performing laser annealing after having implanted impurities into the back surface of the semiconductor substrate 10. Next, the drain electrode 18 is formed on an entirety of the back surface of the semiconductor substrate 10. The drain electrode 18 can be formed, for example, by sputtering.

By performing these steps, the semiconductor device 100 shown in FIG. 2 is completed.

In the semiconductor device 100 according to the first embodiment, the embedded insulating layers 32b to 32e, inside of and above the plurality of termination trenches 30a to 30j, are not continuous with one another. Since the total amount of the insulating material in each of the embedded insulating layers 32b to 32e is small, the amount of contraction during the heat treatment can be restrained to be small. This restrains a high stress from being generated in each of the embedded insulating layers. This in turn makes it possible to restrain the embedded insulating layers 32b to 32e from deteriorating or specifically, for example, from cracking.

As shown in FIG. 2, in the semiconductor device 100 according to the first embodiment, the gate wiring 44 is provided above the embedded insulating layer 32b and is not provided above the embedded insulating layers 32c, 32d, and 32e. That is, in the semiconductor device 100 according to the first embodiment, the gate wiring 44 is provided at the upper surface of the portion in which the embedded insulating layer 32b and the interlayer insulating film 40 are provided at the upper surface of the semiconductor substrate 10 (i.e., a portion in Which a thick insulating layer is provided) and is not provided in the portion in which only the interlayer insulating film 40 is provided at the upper surface of the semiconductor substrate 10 (i.e., a portion in which a thin insulating layer is provided, above the termination trenches 30h to 30j). Since the gate wiring is located in the portion in which a thick insulating layer is provided, the voltage resistance of the semiconductor device 100 can be sufficiently secured.

Further, in the manufacturing method according to the first embodiment, the embedded insulating layer 32 above the termination trenches 30h, 30i, and 30j is removed by etch hack. Thereafter, the gate wiring 44 is formed above the embedded insulating layer 32b in the region that was not etched back (i.e., a region in which the termination trenches 30a to 30g are formed) such that the gate wiring 44 does not make contact with the region that was etched back (i.e., a region in which the termination trenches 30h, 30i, and 30j are formed). This makes it possible to appropriately form the semiconductor device 100 including the features described above.

Correspondence relationships between the first embodiment and the claims are mentioned here. The portion of the embedded insulating layer 32b that is located insides of the termination trenches 30a to 30g and the embedded insulating layers 32c, 32d, and 32e are examples of an "inner trench insulating layer." The portion of the embedded insulating layer 32b that is located at the upper surface of the semiconductor substrate 10 and the interlayer insulating film 40 are examples of an "upper surface insulating layer." The embedded insulating layer 32b and the interlayer insulating film 40 formed above the termination trenches 30e to 30g are examples of a "first portion." The interlayer insulating film 40 formed above the termination trenches 30h to 30j are examples of a "second portion." The portion of the embedded insulating layer 32b that is located at the upper surface of the semiconductor substrate 10 is an example of a "first layer." The interlayer insulating film 40 is an example of a "second layer." The region in which the termination trenches 30e to 30g are provided is an example of a "first region." The region in which the termination trenches 30h to 30j are provided is an example of a "second region."

Second Embodiment (Structure of Semiconductor Device 200)

In the following, a semiconductor device 200 according to a second embodiment will be described with reference to FIGS. 9 to 17. As shown in FIG. 1, as with the semiconductor device 100, the semiconductor device 200 according to the second embodiment also includes a semiconductor substrate 10 in which an element region 110 and a termination region 120 surrounding the element region 110 are provided. The semiconductor device 200 according to the second embodiment is also a power MOSFET.

Figure 9:
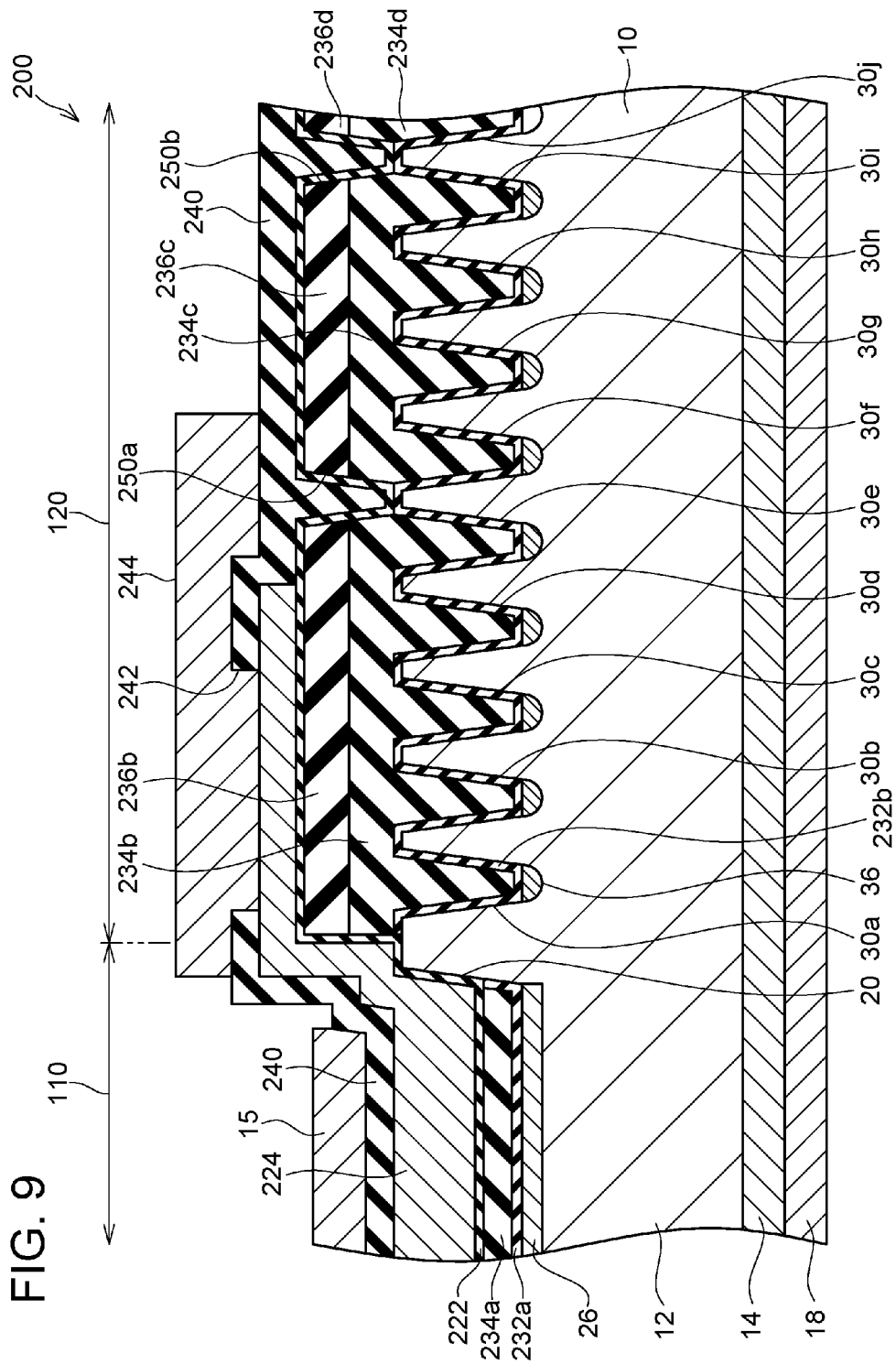
FIG. 9 is a cross-sectional view of the semiconductor device according to the second embodiment as taken along the line II-II.
Figure 10:
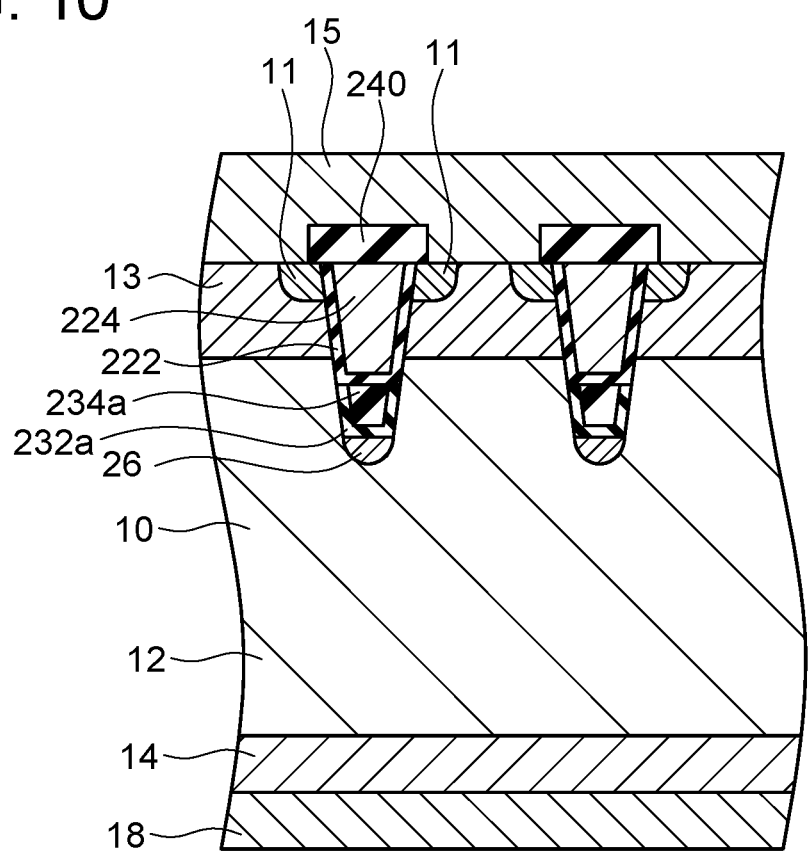
FIG. 10 is a cross-sectional view of the semiconductor device according to the second embodiment as taken along the line III-III.

With reference to FIGS. 9 and 10, structures in the element region 110 and the termination region 120 are described. Those elements of the semiconductor device 200 according to the second embodiment which are identical to those of the semiconductor device 100 (see FIG. 2) according to the first embodiment are given the same reference numbers in FIGS. 9 and 10, and as such, will not be described in detail below.

As shown in FIG. 1, also in the second embodiment, the plurality of gate trenches 20 is provided in the surface of the semiconductor substrate 10 in the element region 110. As shown in FIG. 10, the p-type floating region 26 is provided at the lower end of each of the gate trenches 20. A first insulating layer 232a is provided inside of the gate trench 20 near the lower end thereof. A second insulating layer 234a is provided above the first insulating layer 232a. A refraction index of the first insulating layer 232a is larger than a refraction index of the second insulating layer 234a. A gate insulating film 222 is provided above the second insulating layer 234a and at the inner-side surface of the gate trench 20. A gate electrode 224 filled in the gate trench 20 is provided inside of the gate insulating film 222. An interlayer insulating film 240 is provided at an upper surface of the gate electrode 224. The interlayer insulating film 240 allows the gate electrode 224 to be electrically insulated from the source electrode 15. The interlayer insulating film 240 has higher phosphorus and boron contents per unit volume than the first and second insulating layers 232a and 234a.

As shown in FIG. 9, the plurality of termination trenches 30a to 30j is provided at the surface of the semiconductor substrate 10 in the termination region 120. Each of the termination trenches 30a to 30j is provided at substantially the same depth as the gate trenches 20 in the element region 110. The p-type floating region 36 is provided at the lower end of each of the termination trenches 30a to 30j.

A first insulating layer 232b is provided inside of the termination trenches 30a to 30j. The first insulating layer 232b is also provided at an upper surface portion of a partition wall between each of the termination trenches 30a to 30j and its adjacent one.

A second insulating layer 234b is provided inside of the first insulating layer 232b in the termination trenches 30a to 30e. The second insulating layer 234b is filled in the termination trenches 30a to 30e. Further, the second insulating layer 234b is also laminated on an upper surface of the semiconductor substrate 10 in an area in which the termination trenches 30a to 30e are provided (i.e., upper surfaces of the partition walls between the adjacent termination trenches). The first insulating layer 232b and the second insulating layer 234b are insulating layers having the same properties as the first insulating layer 232a and the second insulating layer 234a in the element region 110, respectively. That is, a refraction index of the first insulating layer 232b is larger than a refraction index of the second insulating layer 234b. A third insulating layer 236b is provided at an upper surface of the second insulating layer 234b. A refraction index of the third insulating layer 236b is larger than the refraction index of the second insulating layer 234a. It should be noted that either the refraction index of the third insulating layer 236b or the refraction index of the first insulating layer 232b may be larger than the other, or the refraction index of the third insulating layer 236b and the refraction index of the first insulating layer 232b may be equal to each other.

Similarly, a second insulating layer 234c is provided inside of the first insulating layer 232b in the termination trenches 30f to 30i. Further, the second insulating layer 234c is filled in the termination trenches 30f to 30i. Further, the second insulating layer 234c is also laminated on the upper surface of the semiconductor substrate 10 in an area in which the termination trenches 30f to 30i are provided. A third insulating layer 236c is provided at an upper surface of the second insulating layer 234c. The second insulating layer 234c and the third insulating layer 236c have the same properties as the second insulating layer 234b and the third insulating layer 236b.

Similarly, a second insulating layer 234d is provided inside of the first insulating layer 232b in the termination trench 30j. Further, the second insulating layer 234d is filled in the termination trench 30j. Further, the second insulating layer 234d is also laminated on the upper surface of the semiconductor substrate 10 in an area in which the termination trench 30j is provided. A third insulating layer 236d is provided at an upper surface of the second insulating layer 234d. The second insulating layer 234d and the third insulating layer 236d, too, have the same properties as the second insulating layer 234b and the third insulating layer 236b.

The second insulating layer 234b and the third insulating layer 236b are partitioned from the second insulating layer 234c and the third insulating layer 236c by a concave portion 250a. In the concave portion 250a, a part of the gate insulating film 222 and a part of the interlayer insulating film 240 are filled. The concave portion 250a is provided above the partition wall between the termination trenches 30e and 30f The first insulating layer 232b is present between a lower end of the concave portion 250a and an upper surface of the partition wall between the termination trenches 30e and 30f That is, the first insulating layer 232b and the interlayer insulating film 240 are laminated above a partition wall corresponding to the concave portion 250a (i.e., the partition wall between the termination trenches 30e and 30f), and the second insulating layers and the third insulating layers are not laminated above the partition wall corresponding to the concave portion 250a. Meanwhile, the first insulating layer 232b, the second insulating layer 234b, and the third insulating layer 236b are laminated above a partition wall not corresponding to the concave portion 250a (i.e., the partition wall between the termination trenches 30a and 30b).

Similarly, the second insulating layer 234c and the third insulating layer 236e are partitioned from the second insulating layer 234d and the third insulating layer 236d by a concave portion 250b. In the concave portion 250b, a part of the gate insulating film 222 and a part of the interlayer insulating film 240 are filled, too. The concave portion 250b is provided above the partition wall between the termination trenches 30i and 30j. The first insulating layer 232b is present between a lower end of the concave portion 250b and an upper surface of the partition wall between the termination trenches 30i and 30j. That is, the first insulating layer 232b and the interlayer insulating film 240 are laminated above a partition wall corresponding to the concave portion 250b (i.e. the partition wall between the termination trenches 30i and 30j), and the second insulating layers and the third insulating layers are not laminated above the partition wall corresponding to the concave portion 250b. Meanwhile, the first insulating layer 232b, the second insulating layer 234c, and the third insulating layer 236c are laminated above a partition wall not corresponding to the concave portion 250b (i.e., the partition wall between the termination trenches 30f and 30g).

That is, in the semiconductor device 200 according to the second embodiment, the insulating layers (specifically, the second insulating layers and the third insulating layers) provided at the upper surface of the semiconductor substrate 10 in the termination region 120 are divided into three portions by the concave portions 250a and 250b. An interval between the two adjacent concave portions 250a and 250b is longer than an interval between two adjacent termination trenches (e.g., the termination trenches 30a and 30b).

The gate insulating 222 is provided at upper surfaces of the third insulating layers 236b, 236c, and 236d and inner surfaces of the concave portions 250a and 250b in the termination region 120. The gate insulating film 222 in the termination region 120 is continuous with the gate insulating film 222 in the element region 110. A part of the gate electrode 224 provided in the element region 110 is extended at a part of an upper surface of the gate insulating film 222 in the termination region 120 (specifically, above the third insulating layer 236b).

An interlayer insulating film 240 is provided at the upper surface of the gate electrode 224 and an upper surface of the gate insulating film 222 in an area in which the gate electrode 224 is not provided. The interlayer insulating film 240 in the termination region 120 is continuous with the interlayer insulating film 240 in the element region 110. As noted above, a part of the interlayer insulating film 240 is filled in the concave portions 250a and 250b. The interlayer insulating film 240 in the termination region 120 includes a portion provided at the upper surface of the gate electrode 224, and in this portion, a contact hole 242 is provided. A gate wiring 244 is provided at an upper surface of the interlayer insulating film 240 in the termination region 120. The gate wiring 244 passes through the contact hole 242 and is electrically connected to the gate electrode 224.

(Manufacturing Method)

The following describes a method for manufacturing the semiconductor device 200 according to the second embodiment. First, the semiconductor substrate 10 is prepared with the plurality of gate trenches 20 and the plurality of termination trenches 30 formed therein (see FIG. 4).

Figure 11:
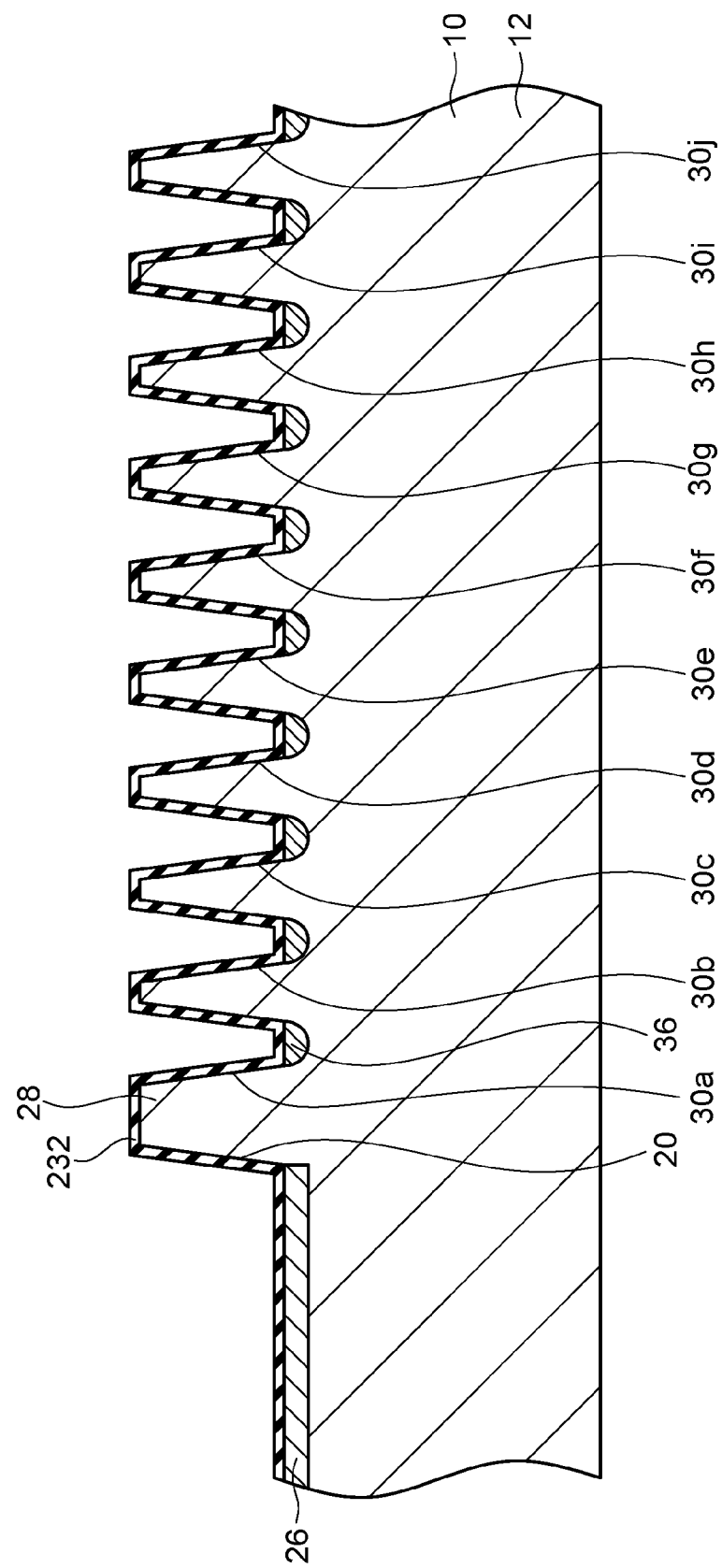
FIG. 11 is a cross-sectional view (1) schematically showing a method of manufacturing a semiconductor device according to the second embodiment.

Next, as shown in FIG. 11, a first insulating layer 232 is deposited at the inner surface of each of the gate trenches 20, on an inner surface of each of the termination trenches 30a to 30j, and on the upper surface of the semiconductor substrate 10 (i.e., on the upper surface of the partition wall 28 between the gate trench 20 and the termination trench 30a and on the upper surfaces of the partition walls between the adjacent termination trenches 30). In this step, the first insulating layer 232 is formed to have such a thickness as to cover the inner surface of each of the gate trenches 20, the inner surface of each of the termination trenches 30, and the upper surface of the semiconductor substrate 10. The first insulating layer 232 is not formed to have such a thickness as to fill each of the trenches. The first insulating layer 232 is formed by performing CVD with TEOS as a raw material. In forming the first insulating layer 232, the CVD is executed under a low pressure. The execution of CVD under a low pressure makes its deposition rate (i.e., deposition speed) slower and allows the first insulating layer 232 to be formed as a dense insulating layer. It should be noted that the first insulating layer 232 is not embedded very well when the CVD is executed under a low pressure. However, the low embeddability will not be problematic as the first insulating layer 232 is thinly formed so as to cover each surface. The first insulating layer 232 can be suitably grown.

Figure 12:
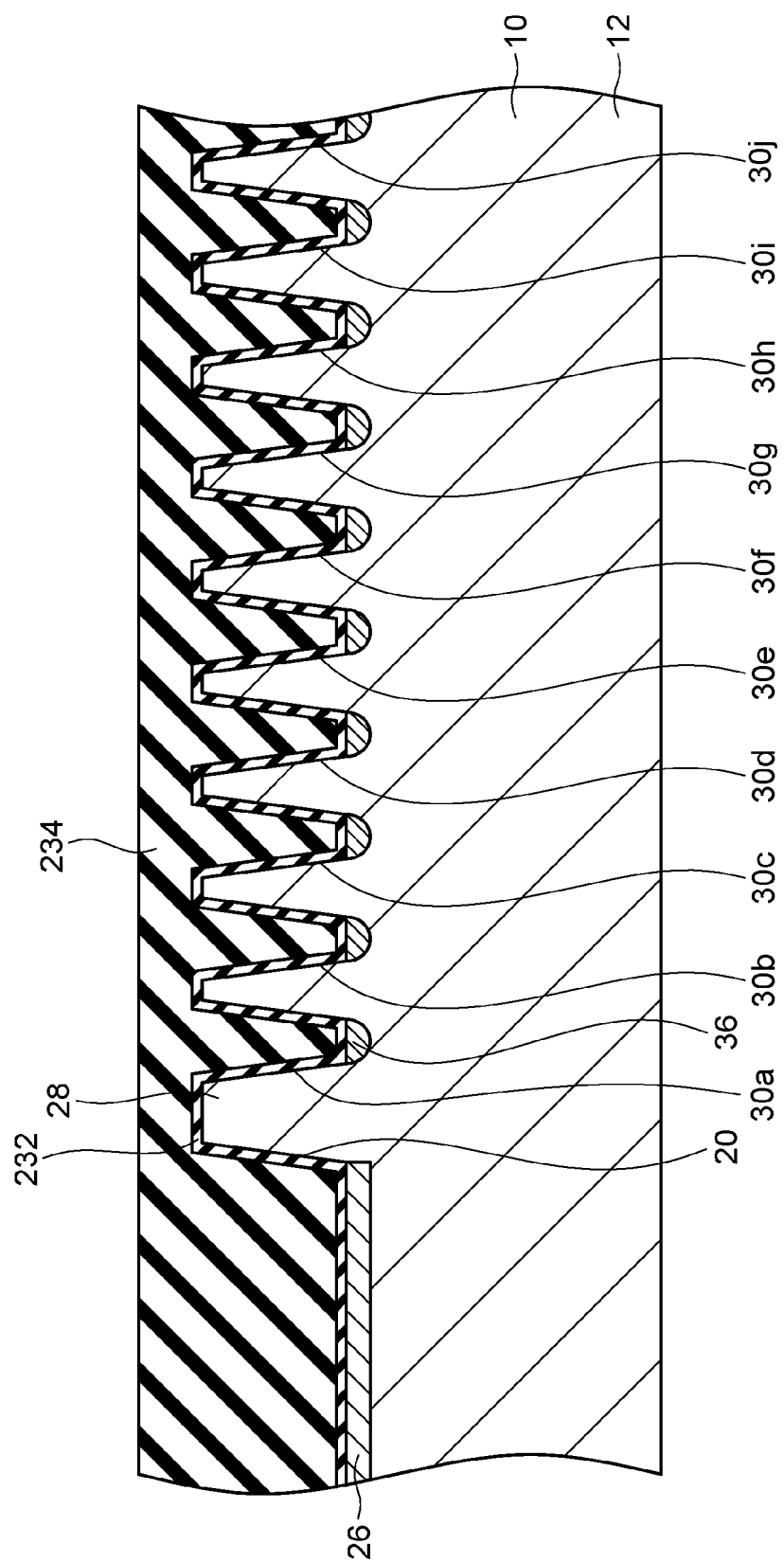
FIG. 12 is a cross-sectional view (2) schematically showing the method of manufacturing a semiconductor device according to the second embodiment.

Next, as shown in FIG. 12, a second insulating layer 234 is deposited at an upper surface of the first insulating layer 232 thus formed. In this step, the second insulating layer 234 fills each of the gate trenches 20 and each of the termination trenches 30a to 30j, and is also laminated on the upper surface of the semiconductor substrate 10. As with the first insulating layer 232, the second insulating layer 234 is formed by performing CVD with TEOS as a raw material. However, note that, in forming the second insulating layer 234, the CVD is executed under a higher pressure than in the case where the first insulating layer 232 is formed. The execution of CVD under a high pressure makes the deposition rate faster and allows the second insulating layer 234 to be formed as a sparse insulating layer. The second insulating layer 234, which is a sparse insulating layer, is excellent in embeddability into trenches, thus making it possible to restrain a void from being formed in the trenches. Therefore, the second insulating layer 234 can be suitably formed without a void being formed in the trenches.

Figure 13:
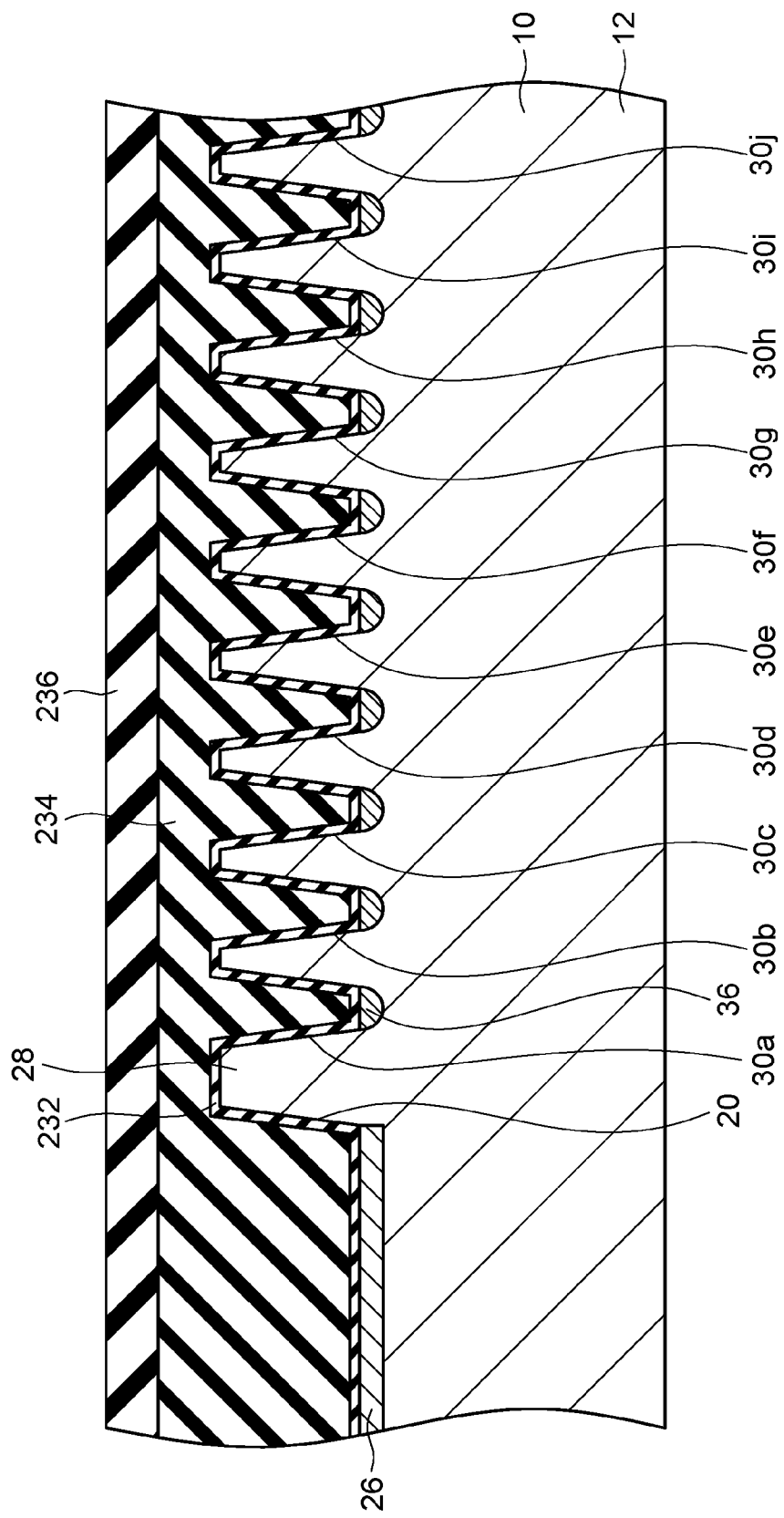
FIG. 13 is a cross-sectional view (3) schematically showing the method of manufacturing a semiconductor device according to the second embodiment.

Next, as shown in FIG. 13, a third insulating layer 236 is deposited at an upper surface of the second insulating layer 234 thus formed. As with the first insulating layer 232 and the second insulating layer 234, the third insulating layer 236 is formed by performing CVD with TEOS as a raw material. In forming the third insulating layer 236, the CVD is executed under a lower pressure than in a case where the second insulating layer 234 is formed. This allows the third insulating layer 236 to be formed as a dense insulating layer at the upper surface of the second insulating layer 234. Although the CVD under a low pressure is poor in embeddability of the insulating material, the embeddability will not be problematic, as the third insulating layer 236 is formed on a flat surface.

Figure 14:
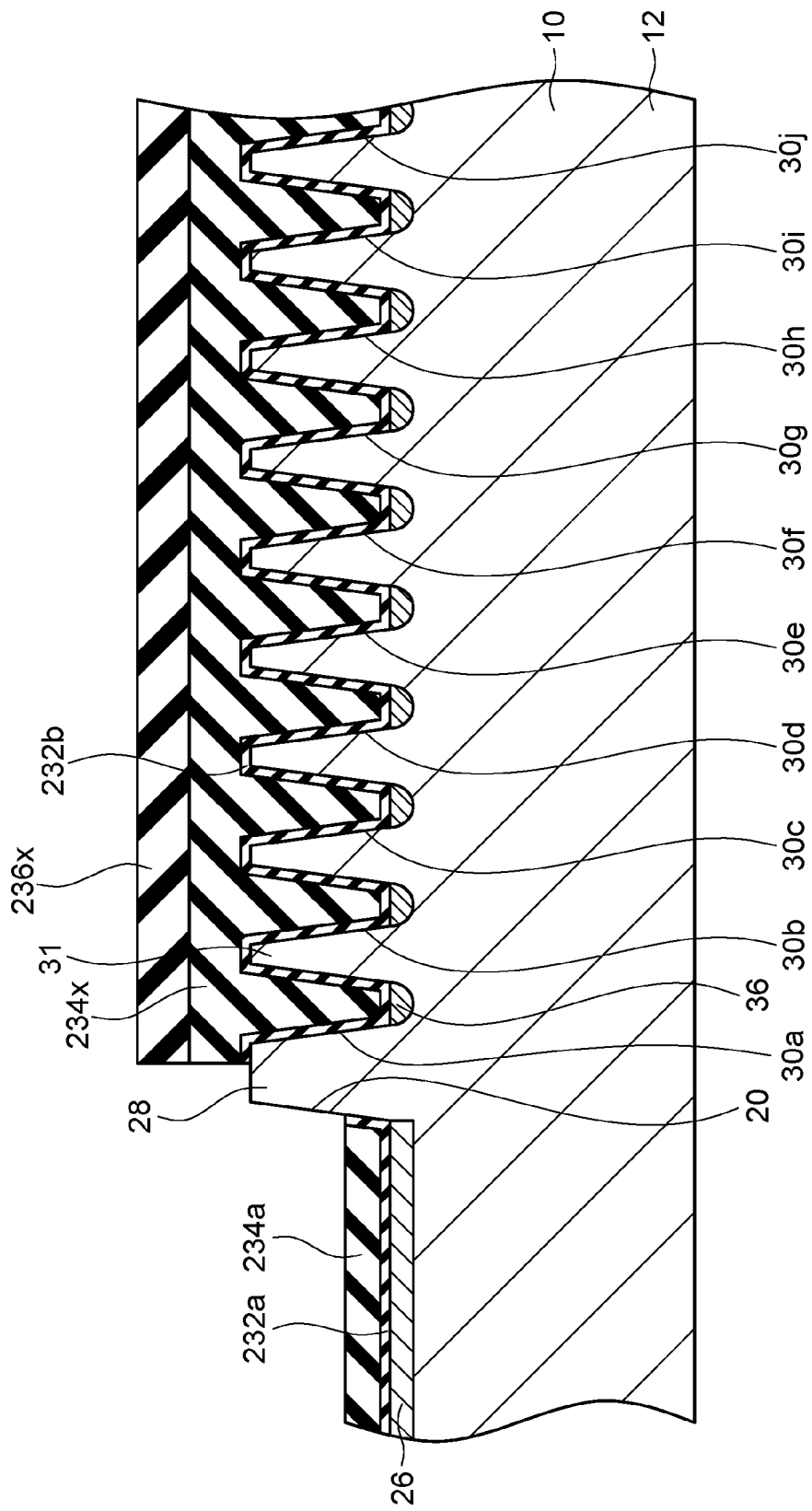
FIG. 14 is a cross-sectional view (4) schematically showing the method of manufacturing a semiconductor device according to the second embodiment.

Next, as shown in FIG. 14, the third insulating layer 236 above the gate trenches 20 is removed by etch back. At this occasion, a part of the first and second insulating layers 232 and 234 in the gate trenches 20 is also removed. It should be noted that a part of the insulating layers 232, 234, and 236 at the upper surface of the partition wall 28 between the gate trenches 20 and the termination trench 30a is also removed. The etch back is performed by performing dry etching after forming a protective film above the termination trenches 30a to 30j. This causes a part of the first insulating layer 232, i.e., a first insulating layer 232a, and a part of the second insulating layer 234, i.e., a second insulating layer 234a, to remain in the gate trenches 20. Further, a first insulating layer 232b, a second insulating layer 234x, and a third insulating layer 236x remain insides of and above the termination trenches 30a to 30j. As noted above, since a void is difficult to be formed during the formation of the second insulating layer 234. An upper surface shape of the second insulating layer 234a remaining in the gate trenches 20 is flat. As a result, a concave portion or the like is not formed in the second insulating layer 234a remaining in the gate trenches 20. This allows the second insulating layer 234a in the gate trenches 20 to exhibit suitable insulation performance.

Figure 15:
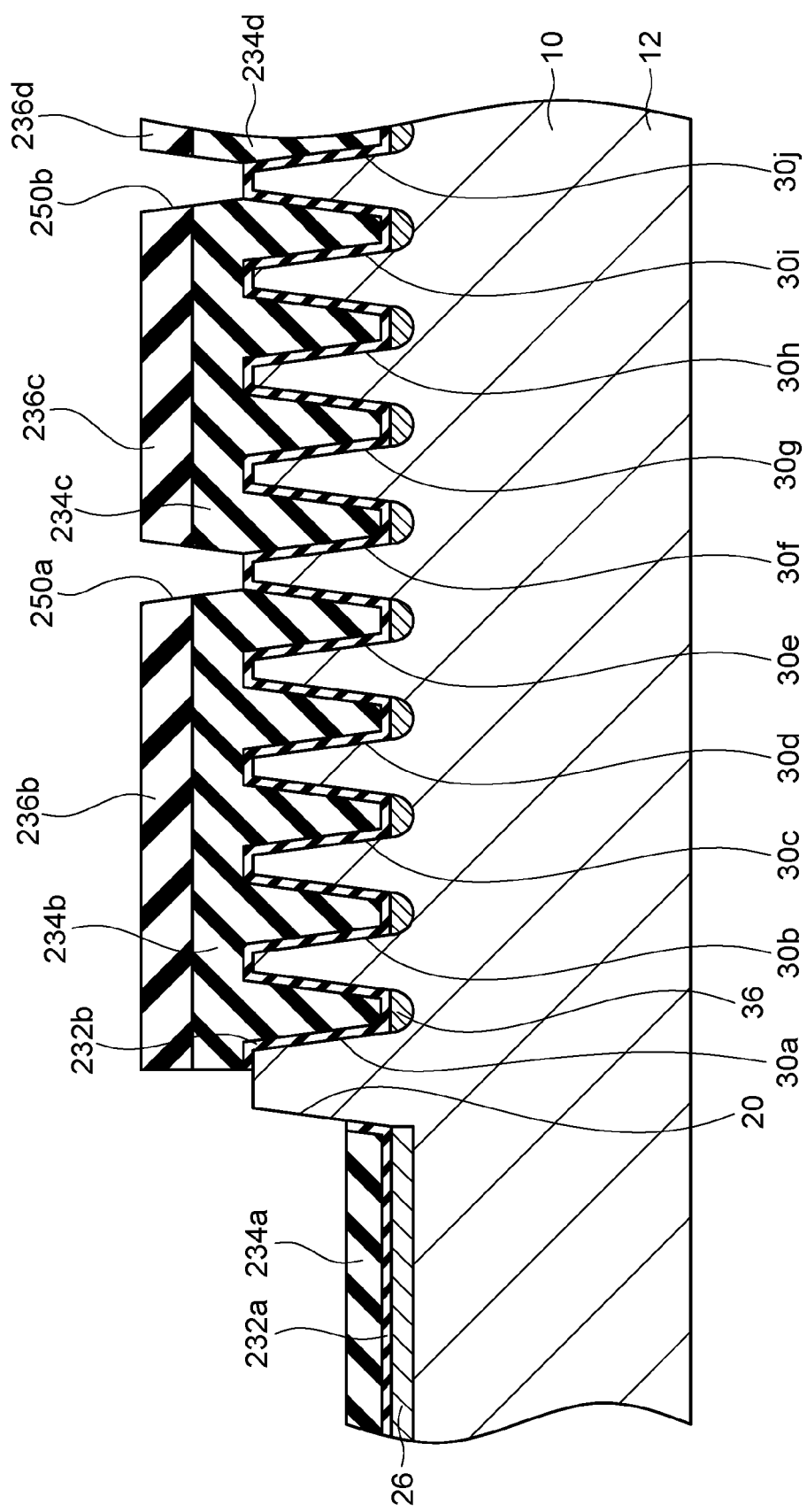
FIG. 15 is a cross-sectional view (5) schematically showing the method of manufacturing a semiconductor device according to the second embodiment.

Next, as shown in FIG. 15, concave portions 250a and 250b are formed by dry etching a part of the second and third insulating layers 234x and 236x. The dry etching is performed with a protective film formed above the semiconductor substrate 10, the protective film having openings in locations in which the concave portions 250a and 250b are to be formed. The concave portions 250a and 250b are formed at such a depth that their lower ends reach the first insulating layer 232b through the second insulating layer 234x and the third insulating layer 236x. The formation of the concave portion 250a causes the second insulating layer 234b and the third insulating layer 236b to be divided from the second insulating layer 234c and the third insulating layer 236c. Further, the formation of the concave portion 250b causes the second insulating layer 234c and the third insulating layer 236c to be divided from the second insulating layer 234d and the third insulating layer 236d.

Next the semiconductor substrate 10 is subjected to heat oxidation treatment. This densifies and stabilizes the first insulating layers 232a and 232b, the second insulating layers 234a to 234d, and the third insulating layers 236b to 236d that have been formed by the CVD. During the heat treatment, each of the insulating layers contracts. Note here that the first insulating layers 232a and 232b and the third insulating layers 236b to 236d, which are dense insulating layers, are more difficult to contract than the second insulating layers 234a to 234d, which are sparse insulating layers. Furthermore, the insulating layers (specifically, the second insulating layers and the third insulating layers) formed at the upper surface of the semiconductor substrate 10 have been divided into three portions by the concave portions 250a and 250b. Since the total amount of the insulating layers in each of the portions thus divided is small, the effect of the contraction is small. This restrains a high stress from being generated in the insulating layers. This in turn makes it possible to restrain the first insulating layers 232a and 232b, the second insulating layers 234a to 234d, and the third insulating layers 236b to 236d from deteriorating or specifically; for example, from cracking. After the densification by such heat treatment, the refraction indices of the first insulating layers 232a and 232b and the third insulating layers 236b to 236d are larger than the refraction indices of the second insulating layers 234a to 234d. Further, this heat oxidation treatment also serves as a process for forming a sacrificial oxide film on inner wall surfaces of the gate trenches 20. Therefore, this heat oxidation treatment forms a sacrificial oxide film on the inner wall surfaces of the gate trenches 20. Thereafter, the oxide film formed on the inner wall surfaces of the gate trenches 20 is removed by wet etching. This removes a layer damaged by the dry etching.

Figure 16:
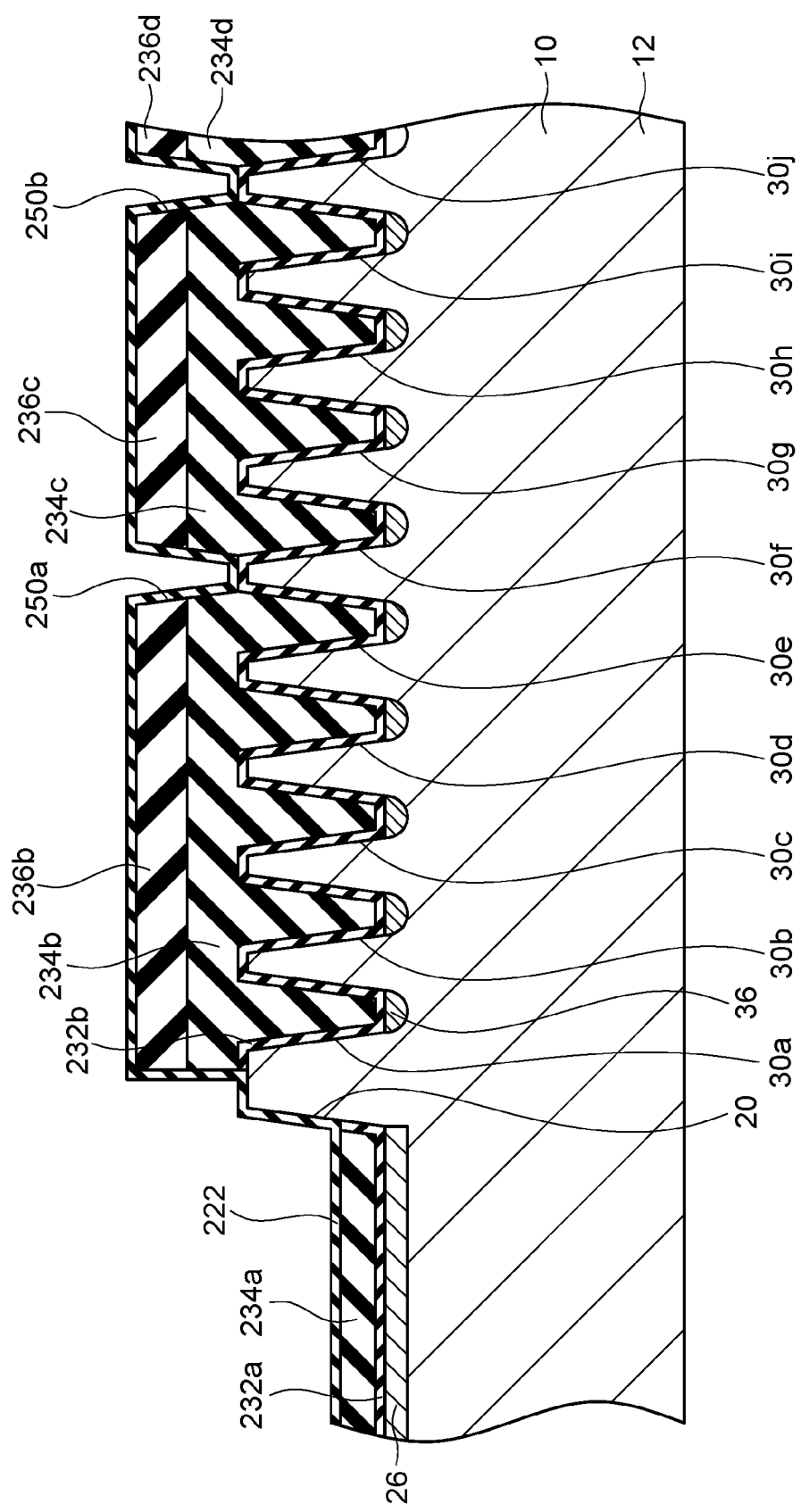
FIG. 16 is a cross-sectional view (6) schematically showing the method of manufacturing a semiconductor device according to the second embodiment.

Next, as shown in FIG. 16, the gate insulating film. 222 is formed by CVD or the like.

Figure 17:
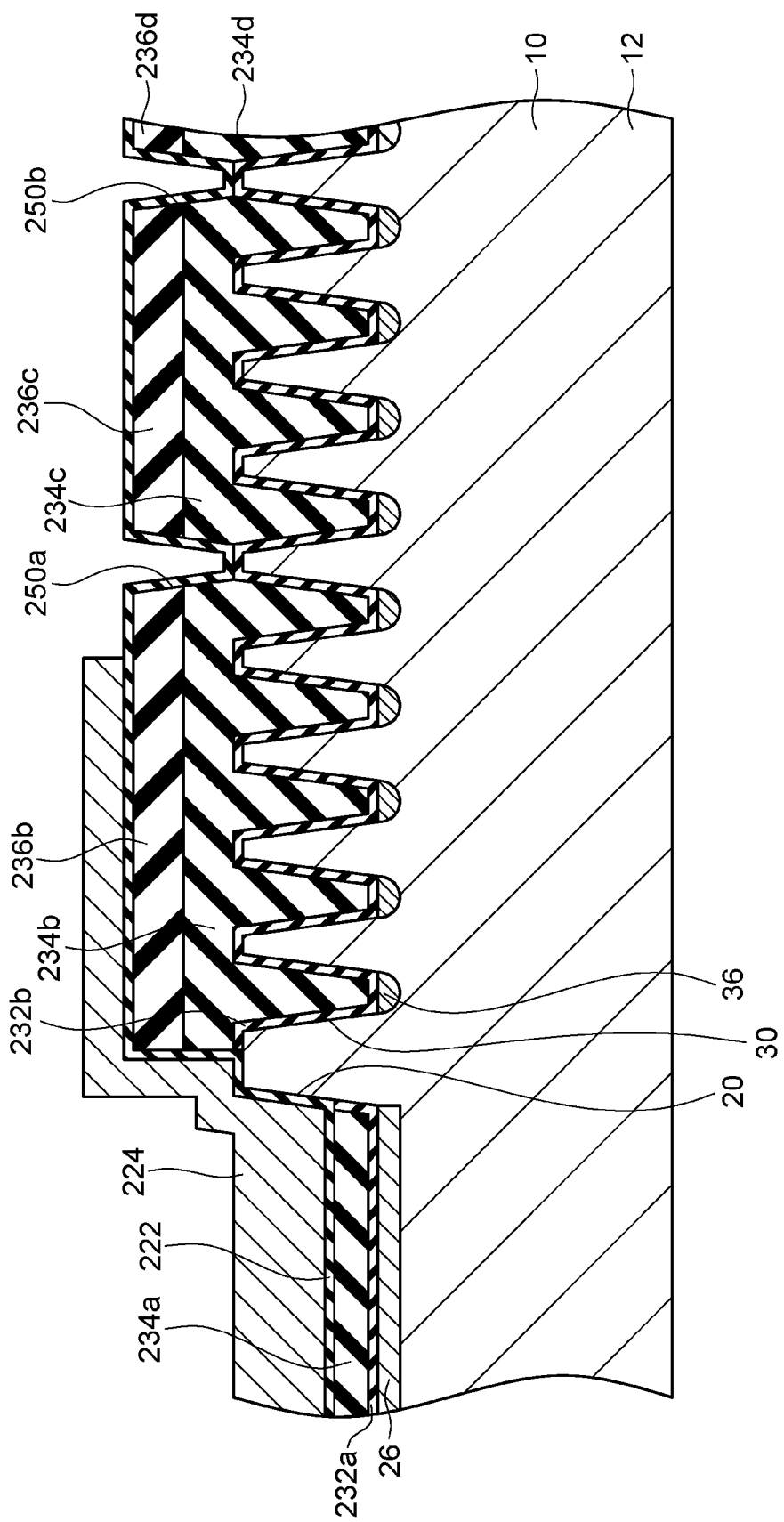
FIG. 17 is a cross-sectional view (7) schematically showing the method of manufacturing a semiconductor device according to the second embodiment.

Next, as shown in FIG. 17, the gate electrode 224 is formed in the gate trenches 20 by depositing polysilicon in a space that has been secured by the etch back. At this occasion, a part of the gate electrode 224 extends onto the upper surface of the gate insulating film 222 formed above the third insulating layer 236b.

Thereafter, an interlayer insulating film 240 is formed at the upper surface of the semiconductor substrate 10 (see FIG. 9). The interlayer insulating film 240 is formed by depositing BPSG by CVD. As noted above, the interlayer insulating film 240, which is made of BPSG, has higher phosphorus and boron contents per unit volume than the first and second insulating films 232a and 234a, which are TEOS films. As a result, the interlayer insulating film 240 is formed at the upper surface of the gate electrode 224 and the upper surface of the gate insulating film 222 in an area in which the gate electrode 224 is not formed.

Thereafter, the contact hole 242 is formed in a portion of the interlayer insulating film 240 that is formed at the upper surface of the gate electrode 224 (see FIG. 9). Next, the gate wiring 244 made of metal is formed at the upper surface of the interlayer insulating film 240. The gate wiring 244 passes through the contact hole 242 and is electrically connected to the gate electrode 224.

Furthermore, thereafter, the drain region 14 is formed on the back surface of the semiconductor substrate 10. The drain region 14 is formed by performing laser annealing after implanting impurities into the back surface of the semiconductor substrate 10. Next, the drain electrode 18 is formed on the entirety of the back surface of the semiconductor substrate 10. The drain electrode 18 can be formed, for example, by sputtering.

By performing these steps, the semiconductor device 200 shown in FIG. 9 is completed.

In the semiconductor device 200 according to the second embodiment, the insulating layers (specifically, the second insulating layers and the third insulating layers) provided at the upper surface of the semiconductor substrate 10 are divided into three portions by the concave portions 250a and 250b. Since the total amount of the insulating layers in each of the portions thus divided is small, the effect of the contraction of the insulating material in the manufacturing process is small. This restrains an excessive high stress from being generated in the insulating material in the process of manufacturing the semiconductor device. This in turn makes it possible to restrain the first insulating layers 232a and 232b, the second insulating layers 234a to 234d, and the third insulating layers 236b to 236d from cracking.

In the semiconductor device 200 according to the second embodiment, the refraction indices of the first insulating layers 232a and 232b and the third insulating layers 236b to 236d are larger than the refraction indices of the second insulating layers 234a to 234d. As noted above, the first insulating layers 232a and 232b and the third insulating layers 236b to 236d are difficult to contract in the process of manufacturing the semiconductor device 200. The second insulating layers 234a to 234d are easy to contract in the process of manufacturing the semiconductor device 200. Since the first insulating layers 232a and 232b and the second insulating layers 234a to 234d are located in the trenches (i.e., the gate trenches 20 and the termination trenches 30), an excessive stress is prevented from being generated due to the contraction of the insulating material in the process of manufacturing the semiconductor device 200. Therefore, in the process of manufacturing the semiconductor device 200, the insulating layers in the trenches are difficult to crack. Further, although the first insulating layers 232a and 232b are not very good in embeddability in the process of manufacturing the semiconductor device 200, the embeddability of the insulating material will not be problematic during the formation of the first insulating layers 232a and 232b, as the first insulating layers 232a and 232b are formed to cover the inner surfaces of the trenches. Thereafter, in forming the second insulating layers 234a to 234b at surfaces of the first insulating layers 232a and 232b, the second insulating layers 234a to 234b can be suitably formed, as the insulating material is good in embedciability. Therefore, in the process of manufacturing the semiconductor device 200, a void is difficult to be generated in the insulating layers in the trenches. That is, the semiconductor device 200 is difficult to suffer from a void or a crack resulting from a void in the insulating layers in the manufacturing process.

Further, the semiconductor device 200 according to the second embodiment includes the third insulating layers 236b to 236d at the upper surfaces of the second insulating layers 234b to 234d. Since a thick insulating layer can be formed below the gate wiring 244, the semiconductor device 200 can be made higher in voltage resistance.

As noted above, in the manufacturing method according to the second embodiment, after the first insulating layer 232, which is a dense insulating layer, the second insulating layer 234, which is a sparse insulating layer, and the third insulating layer 236, which is a dense insulating layer, have been deposited in this order (see FIGS. 11 to 13), the concave portions 250a and 250b are formed (see FIG. 15). Since the semiconductor device 200 is manufactured through these steps, the manufacturing method according to the second embodiment makes it possible to suitably form the semiconductor device 200 including the advantages described above.

Correspondence relationships of description between the second embodiment and the claims are mentioned here. The first insulating layers 232a and 232b, the second insulating layers 234a to 234d, and the third insulating layers 236b to 236d are examples of "a first layer." The interlayer insulating film 240 is an example of "a second layer."

Specific examples of the art disclosed herein have been described in detail, however, these are mere exemplary indications and thus do not limit the scope of the claims. The art described in the claims include modifications and variations of the specific examples presented above. For example, the following modifications may be implemented.

(Modification 1) In the second embodiment described above, as shown in FIG. 9, the third insulating layers 236b to 236d are provided at the upper surfaces of the second insulating layers 234b to 234d in the termination region 120. This does not imply any limitation, in the semiconductor device 200 according to the second embodiment, the third insulating layers 236b to 236d may be omitted. In that case, the gate insulating film 222 may only have to be provided at the upper surfaces of the second insulating layers 234b to 234d.

(Modification 2) In the first embodiment described above, as shown in FIG. 2, no embedded insulating layer is provided at the upper surface of the semiconductor substrate 10 in an area in Which the termination trenches 30h, 30i, and 30j are provided. This does not imply any limitation. A part of an embedded insulating layer may be provided also at the upper surface of the semiconductor substrate 10 in the area in which the termination trenches 30h, 30i, and 30j are provided. In that case, it is preferable that the embedded insulating layer above the termination trenches 30h, 30i, and 30j be thinner than the embedded insulating layer above the termination trenches 30a to 30g.

(Modification 3) In the second embodiment described above, the second insulating layer 234 or the third insulating layer 236 may be thinly located below the concave portions 250a and 250b.

(Modification 4) in each of the embodiments described above, the semiconductor substrate 10 is made of SiC. This does not imply any limitation. The semiconductor substrate 10 may alternatively be made of Si.

(Modification 5) Although the semiconductor devices 100 and 200 are power MOSFETs in each of the embodiments described above, they may be any semiconductor devices, as long as they are trench-gate-type semiconductor devices. For example, the semiconductor devices 100 and 200 may alternatively be IGBTs.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor device comprising a semiconductor substrate in which an element region and a termination region surrounding the element region are provided,
wherein
the element region comprises:
a gate trench;
a gate insulating film covering an inner surface of the gate trench; and
a gate electrode located inside of the gate insulating film,
the termination region comprises:
a plurality of termination trenches provided around the element region;
an inner trench insulating layer located inside of each of the plurality of termination trenches; and
an upper surface insulating layer located at an upper surface of the semiconductor substrate in the termination region,
the upper surface insulating layer comprises a first portion and a second portion having a thinner thickness than the first portion and located at a location separated from the element region than the first portion, and
a gate wiring is located at an upper surface of the first portion and is not located at an upper surface of the second portion.

2. The semiconductor device as in claim 1, wherein
the upper surface insulating layer comprises:
a first layer; and
a second layer having higher phosphorus and boron contents per unit volume than the first layer and located at an upper surface of the first layer,
the upper surface insulating layer in a first region comprises the first layer and the second layer,
the upper surface insulating layer in a second region which is a location separated from the element region than the first region, comprises the second layer and the first layer having a thinner thickness than the first layer in the first region, or comprises the second layer and does not comprise the first layer, and
the gate wiring is located at an upper surface of the upper insulating layer in the first region and is not located at an upper surface of the upper insulating layer in the second region.

3. A semiconductor device comprising a semiconductor substrate in which an element region and a termination region surrounding the element region are provided,
wherein
the element region comprises:
a gate trench;
a gate insulating film covering an inner surface of the gate trench; and
a gate electrode located inside of the gate insulating film,
the termination region comprises:
a plurality of termination trenches provided around the element region; and
an insulating layer provided inside of each of the plurality of termination trenches and at an upper surface of the semiconductor substrate,
the insulating layer comprises:
a first layer; and
a second layer having higher phosphorus and boron contents per unit volume than the first layer and located at an upper surface of the first layer,
a plurality of concave portions is provided at an upper surface of the first layer,
each of the concave portions is extended along a partition wall between adjacent ones of the termination trenches,
an interval between adjacent ones of the concave portions is longer than an interval between the adjacent ones of the termination trenches,
the second layer is filled in each of the concave portions, and
a gate wiring is located at an upper surface of the insulating layer.

4. The semiconductor device as in claim 3, wherein
the first layer comprises:
a first insulating layer covering an inner surface of each of the plurality of termination trenches; and
a second insulating layer filled inside of the plurality of termination trenches covered by the first insulating layer, and
a refraction index of the first insulating layer is larger than a refraction index of the second insulating layer.

5. The semiconductor device as in claim 4, wherein
the first insulating layer and the second layer are laminated on the partition wall corresponding to each of the concave portions, the second insulating layer is not laminated on the partition wall corresponding to each of the concave portions, and
the first insulating layer, the second insulating layer, and the second layer are laminated on the partition wall not corresponding to the concave portions.

6. The semiconductor device as in claim 5, wherein
the first layer comprises a third insulating layer provided at an upper surface of the second insulating layer, and
a refraction index of the third insulating layer is larger than the refraction index of the second insulating layer.

* * * * *